US011363225B2

(12) United States Patent
Moue et al.

(10) Patent No.: US 11,363,225 B2
(45) Date of Patent: Jun. 14, 2022

(54) IMAGE SENSOR

(71) Applicant: Sony Semiconductor Solutions Corporation, Kanagawa (JP)

(72) Inventors: Takashi Moue, Kanagawa (JP); Hiroaki Yatsuda, Fukuoka (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/261,319

(22) PCT Filed: Jun. 27, 2019

(86) PCT No.: PCT/JP2019/025562
§ 371 (c)(1),
(2) Date: Jan. 19, 2021

(87) PCT Pub. No.: WO2020/036005
PCT Pub. Date: Feb. 20, 2020

(65) Prior Publication Data
US 2021/0258532 A1   Aug. 19, 2021

(30) Foreign Application Priority Data

Aug. 16, 2018 (JP) .............................. JP2018-153248

(51) Int. Cl.
*H04N 5/374* (2011.01)
*H04N 5/357* (2011.01)
(Continued)

(52) U.S. Cl.
CPC ... *H04N 5/37455* (2013.01); *H01L 27/14612* (2013.01); *H04N 5/357* (2013.01); *H04N 5/378* (2013.01); *H04N 5/37457* (2013.01)

(58) Field of Classification Search
CPC .............. H04N 5/37455; H04N 5/357; H04N 5/37457; H04N 5/378; H04N 5/3765;
(Continued)

(56) References Cited

U.S. PATENT DOCUMENTS

2003/0071748 A1*  4/2003  Huang ................... H04N 5/378
                                                 341/155
2005/0151680 A1*  7/2005  Kearney ............... H03M 1/129
                                                 341/172
(Continued)

FOREIGN PATENT DOCUMENTS

CN          107359876 A      11/2017
EP          3590254 A         1/2020
(Continued)

OTHER PUBLICATIONS

Extended European Search Report dated Jun. 2, 2021 for corresponding European Application No. 19850065.4.
(Continued)

*Primary Examiner* — Abdelaaziz Tissire
(74) *Attorney, Agent, or Firm* — Michael Best & Friedrich LLP

(57) ABSTRACT

It is an object of the present technology to provide an image sensor capable of reducing crosstalk in an AD conversion unit. The image sensor includes: capacitors in an even-numbered column region; and a capacitor in an odd-numbered column region disposed facing the capacitors in the even-numbered column region with different areas.

7 Claims, 15 Drawing Sheets

(51) Int. Cl.
 H01L 27/146 (2006.01)
 H04N 5/378 (2011.01)
 H04N 5/3745 (2011.01)

(58) Field of Classification Search
 CPC .............. H04N 5/359; H01L 27/14612; H01L 27/14609; H01L 27/146; H03M 1/123; H03M 1/1295; H03M 1/18; H03M 1/56; H04M 1/56
 See application file for complete search history.

(56) References Cited

U.S. PATENT DOCUMENTS

| | | | |
|---|---|---|---|
| 2008/0239106 A1 | 10/2008 | Sano | |
| 2009/0128653 A1* | 5/2009 | Tanaka | H04N 5/374 348/222.1 |
| 2013/0068930 A1* | 3/2013 | Nakamura | H04N 5/37455 250/208.1 |
| 2013/0112852 A1 | 5/2013 | Kizuna et al. | |
| 2014/0022430 A1 | 1/2014 | Ueno et al. | |
| 2017/0359542 A1 | 12/2017 | Bairo | |
| 2018/0124345 A1 | 5/2018 | Aoki | |
| 2020/0053308 A1* | 2/2020 | Niwa | H03M 1/34 |

FOREIGN PATENT DOCUMENTS

| | | |
|---|---|---|
| JP | 2013-98895 A | 5/2013 |
| JP | 2013-240006 A | 11/2013 |
| WO | 2016/139857 A1 | 9/2016 |
| WO | 2017/110484 A1 | 6/2017 |

OTHER PUBLICATIONS

International Search Report (PCT/ISA/210), International Application No. PCT/JP2019/025562, dated Sep. 2, 2019.
Notification of Transmittal of the International Search Report and the Written Opinion of the International Searching Authority, or the Declaration (PCT/ISA/220), International Application No. PCT/JP2019/025562, dated Sep. 10, 2019.
Written Opinion of the International Search Authority (PCT/ISA/237), International Application No. PCT/JP2019/025562, dated Sep. 10, 2019.

* cited by examiner

IMAGE SENSOR

TECHNICAL FIELD

The present technology relates to an image sensor.

BACKGROUND ART

Conventionally, there has been known a solid-state imaging device that includes a pixel unit including a plurality of pixels arranged in a matrix (see, for example, Patent Literature 1). The solid-state imaging device includes an AD conversion unit for AD (analog-to-digital)-converting an analog pixel signal based on an electrical signal that has been photoelectrically converted by a photoelectric conversion element provided in the plurality of pixels. An image is displayed on a display device or the like on the basis of the digital pixel signal AD-converted by the AD conversion unit.

CITATION LIST

Patent Literature

Patent Literature 1: Japanese Patent Application Laid-open No. 2014-023065

DISCLOSURE OF INVENTION

Technical Problem

The AD conversion unit is provided for each column of the plurality of pixels provided in the pixel unit. Therefore, the plurality of AD conversion units is arranged in parallel in one row. Further, adjacent AD conversion units are arranged close to each other. The comparator provided in the AD conversion unit has an input capacitance. Since the voltage corresponding to the analog pixel signal is held in this input capacitance when AD conversion is performed thereon, the voltage applied to this input capacitance varies during AD conversion. This variation in voltage interferes with the input capacitance of the comparator provided in the adjacent AD conversion unit, and crosstalk occurs in some cases. When crosstalk occurs in the AD conversion unit, the AD conversion unit affected by the adjacent AD conversion unit (AD conversion unit on the victim side) AD-converts the analog signal obtained by superimposing the voltage variation of the adjacent AD conversion unit on the analog pixel signal input from the pixel. As a result, a problem that an image in which noise has occurred is displayed on a display device or the like occurs.

It is an object of the present technology to provide an image sensor capable of reducing crosstalk in an AD conversion unit.

Solution to Problem

An image sensor according to an embodiment of the present technology includes: a first capacitance that is connected to a first signal line connected to a first pixel including a photoelectric conversion element and disposed in a first region; a second capacitance that is disposed in the first region and connected to a reference signal generation unit that generates a reference signal; a third capacitance that is disposed in the first region and provided to be connectable to the first capacitance and the second capacitance; a fourth capacitance that is disposed in the first region and connected to a supply unit of a reference potential; a first differential amplifier that is disposed in the first region and includes one input unit and a different input unit, the first capacitance, the second capacitance, and the third capacitance being connected to the one input unit, the fourth capacitance being connected to the different input unit; a fifth capacitance that is connected to a second signal line connected to a second pixel including a photoelectric conversion element and disposed in a second region adjacent to the first region to face the first capacitance and the fourth capacitance with different areas; a sixth capacitance that is disposed in the second region and connected to the reference signal generation unit; a seventh capacitance that is disposed in the second region and provided to be connectable to the fifth capacitance and the sixth capacitance; an eighth capacitance that is disposed in the second region, the reference potential being supplied to the eighth capacitance; and a second differential amplifier that is disposed in the second region and includes one input unit and a different input unit, the fifth capacitance, the sixth capacitance, and the seventh capacitance being connected to the input unit, the eighth capacitance being connected to the different input unit.

Each of the first capacitance, the third capacitance, the fourth capacitance, the fifth capacitance, the seventh capacitance, and the eighth capacitance may include a plurality of split capacitances, and fifth split capacitances that are the split capacitances of the fifth capacitance may be arranged so that the number of the fifth split capacitances facing first split capacitances that are the split capacitances of the first capacitance and the number of the fifth split capacitances facing fourth split capacitances that are the split capacitances of the fourth capacitance differ.

Third split capacitances that are the split capacitances of the third capacitance may be aggregated within a predetermined range of the first region, seventh split capacitances that are the split capacitances of the seventh capacitance may be aggregated within a predetermined range of the second region, and the plurality of third split capacitances and the plurality of seventh split capacitances may be arranged facing each other in a one-to-one relationship.

The image sensor may further include: a first switching element for switching between connection and disconnection of the first capacitance and the third capacitance; a second switching element for switching between connection and disconnection of the second capacitance and the third capacitance; a third switching element for switching between connection and disconnection of two adjacent split capacitances of the third split capacitances; a fifth switching element for switching between connection and disconnection of the fifth capacitance and the seventh capacitance; a sixth switching element for switching between connection and disconnection of the sixth capacitance and the seventh capacitance; and a seventh switching element for switching between connection and disconnection of two adjacent split capacitances of the seventh split capacitances.

The total number of the first split capacitances, the second capacitances, and the third split capacitances may be the same as the total number of fourth split capacitances that are the split capacitances of the fourth capacitance, the total number of the fifth split capacitances, the sixth capacitances, and the seventh split capacitances may be the same as the total number of eighth split capacitances that are the split capacitances of the eighth capacitance, and the total number of the first split capacitances, the second capacitances, the third split capacitances, and the fourth split capacitances may be the same as the total number of the fifth split capacitances, the sixth capacitances, the seventh split capacitances, and the eighth split capacitances.

Each of the plurality of first split capacitances, the second capacitance, each of the plurality of third split capacitances, each of the plurality of fourth split capacitances, each of the fifth split capacitances, the sixth capacitance, each of the plurality of seventh split capacitances, and each of the plurality of eighth split capacitances may have the same capacitance value.

Each of the plurality of first split capacitances may include one electrode connected to the first signal line, and a different electrode connected to the one input unit of the first differential amplifier, the second capacitance may include one electrode connected to the reference signal generation unit, and a different electrode connected to the one input unit of the first differential amplifier, each of the plurality of third split capacitances may include one electrode connected to the third switching element, and a different electrode connected to the one input unit of the first differential amplifier, each of the plurality of fourth split capacitances may include one electrode connected to the supply unit of the reference potential, and a different electrode connected to the different input unit of the first differential amplifier, each of the plurality of fifth split capacitances may include one electrode connected to the second signal line, and a different electrode connected to the one input unit of the second differential amplifier, the sixth capacitance may include one electrode connected to the reference signal generation unit, and a different electrode connected to the one input unit of the second differential amplifier, each of the plurality of seventh split capacitances may include one electrode connected to the seventh switching element, and a different electrode connected to the one input unit of the second differential amplifier, and each of the plurality of eighth split capacitances may include one electrode connected to the supply unit of the reference potential, and a different electrode connected to the different input unit of the second differential amplifier.

MODE(S) FOR CARRYING OUT THE INVENTION

An image sensor according to an embodiment of the present technology will be described using FIG. 1 to FIG. 12.

<Configuration Example of Digital Camera>

A digital camera to which the image sensor according to this embodiment is applied will be described first using FIG. 1. A digital camera to which the image sensor according to the present technology has been applied is capable of capturing both a still image and a moving image.

Figure 1:
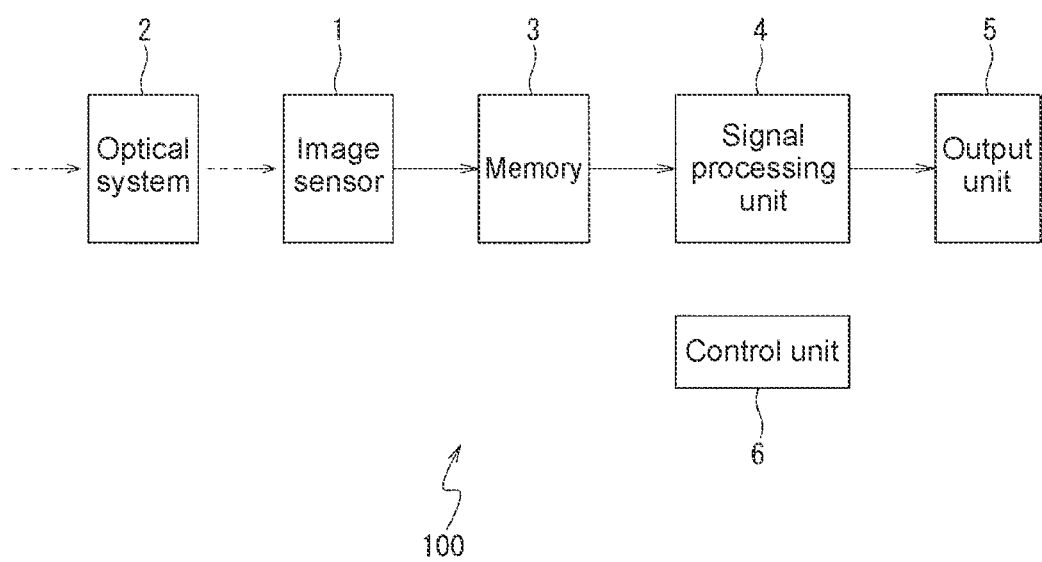
FIG. 1 is a block diagram showing a schematic configuration of a digital camera to which an image sensor according to the present technology has been applied.

As shown in FIG. 1, a digital camera 100 includes an optical system 2, an image sensor 1, a memory 3, a signal processing unit 4, an output unit 5, and a control unit 6.

The optical system 2 includes, for example, a zoom lens (not shown), a focus lens, and an aperture. The optical system 2 is configured to cause external light to enter the image sensor 1.

The image sensor 1 is, for example, a CMOS image sensor. The image sensor 1 is configured to receive incident light that has entered from the optical system 2, and perform photoelectric conversion on the received incident light. Thus, the image sensor 1 is configured to output image data corresponding to the incident light that has entered from the optical system 2.

The memory 3 is configured to temporarily store the image data to be output by the image sensor 1.

The signal processing unit 4 is configured to perform signal processing using the image data stored in the memory 3, and supply the image data after the signal processing to the output unit 5. For example, the signal processing unit 4 performs processing such as removing noise mixed in the image data and adjusting white balance.

The output unit 5 outputs the image data supplied from the signal processing unit 4. The output unit 5 includes, for example, a display device (not shown) including liquid crystal or the like. The output unit 5 is configured to display, as a so-called through image, an image corresponding to the image data supplied from the signal processing unit 4.

Further, the output unit 5 includes a driver (not shown) for driving a recording medium such as a semiconductor memory, a magnetic disk, and an optical disk. The output unit 5 is configured to record the image data supplied from the signal processing unit 4 on the recording medium.

The control unit 6 is configured to control the blocks constituting the digital camera 100 in accordance with operations of the digital camera 100 by a user or the like.

<Configuration Example of Image Sensor>

Next, a schematic configuration of the image sensor according to this embodiment will be described using FIG. 2 to FIG. 6.

Figure 2:
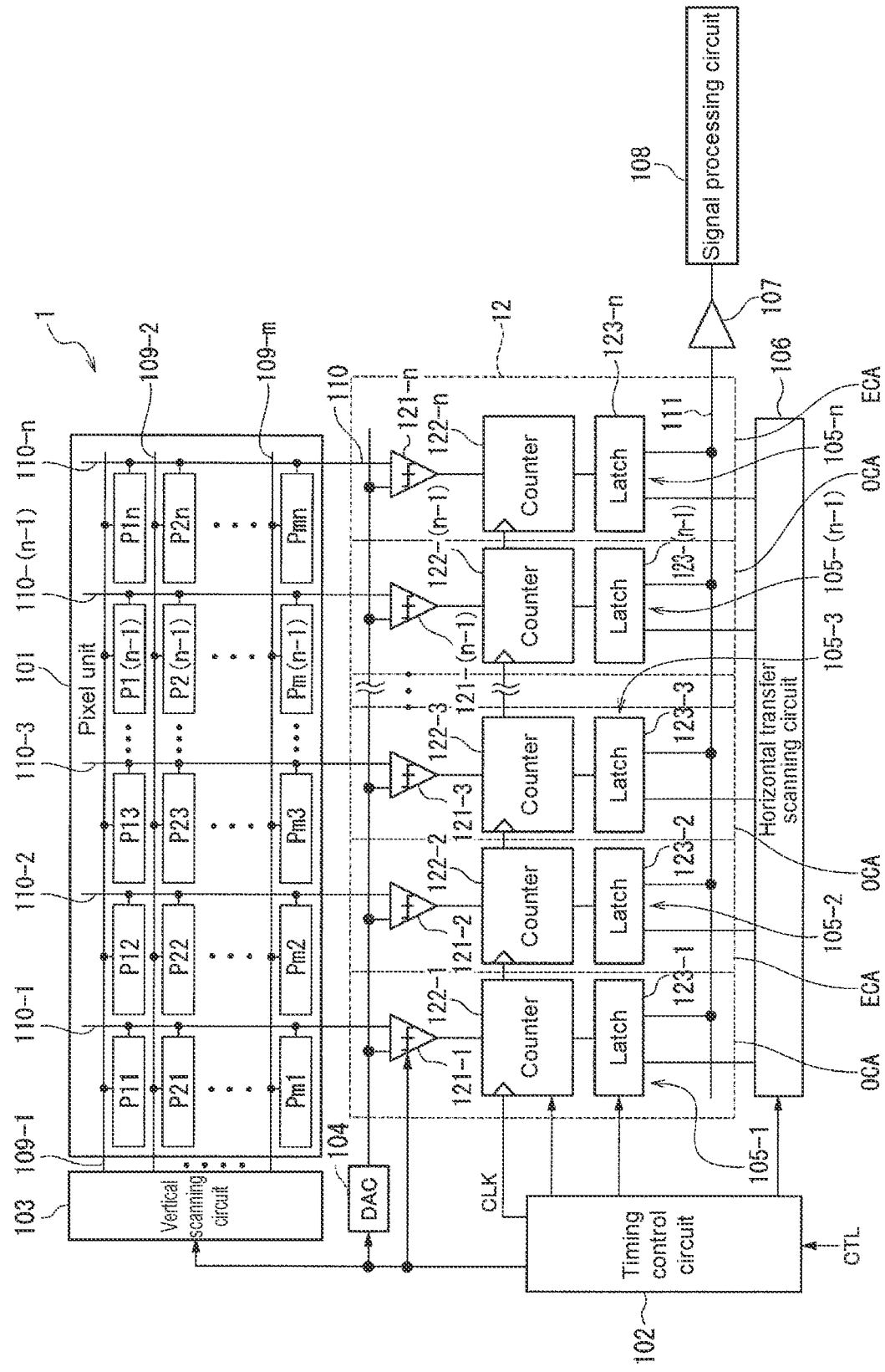
FIG. 2 is a block diagram showing a schematic configuration of an image sensor according to an embodiment of the present technology.

As shown in FIG. 2, the image sensor 1 according to this embodiment includes a pixel unit 101, a timing control circuit 102, a vertical scanning circuit 103, a DAC (digital-analog converter) 104, an ADC (analog-digital convertor) group 12, a horizontal transfer scanning circuit 106, an amplifier circuit 107, and a signal processing circuit 108.

As shown in FIG. 2, in the pixel unit 101, unit pixels (hereinafter, referred to also simply as pixels) including a photoelectric conversion element for photoelectrically converting incident light into a charge amount corresponding to the amount of the incident light are arranged in a matrix. In this embodiment, the pixel unit 101 is provided with unit pixels P11 to Pmn in m rows and n columns (m and n are natural numbers) (hereinafter, all or a part of the unit pixels P11 to Pmn will be referred to simply as "unit pixels P" in the case where it is unnecessary to individually distinguish them from each other). In FIG. 2, a part (14) of the unit pixels P of the pixel array of m rows and n columns is illustrated. The unit pixels P11 to Pmn have the same circuit configuration. The specific circuit configuration of the unit pixels P11 to Pmn will be described below with reference to FIG. 3.

Further, in the pixel unit 101, m pixel drive lines 109-1 to 109-$m$ are wired along the right-and-left direction of the drawing (pixel array direction of the pixel row/horizontal direction) with respect to the matrix-like pixel array. Further, in the pixel unit 101, n vertical signal lines 110-1 to 110-$n$ are wired along the up-and-down direction of the drawing (pixel array direction of the pixel column/vertical direction). One end of each of the pixel drive lines 109-1 to 109-$m$ is connected to an output end of the vertical scanning circuit 103 in the corresponding row. The respective unit pixels P11 to Pmn are arranged corresponding to the intersections of the pixel drive lines 109-1 to 109-$m$ and the vertical signal lines 110-1 to 110-$n$. Note that although each of the pixel drive lines 109-1 to 109-$m$ is shown as one line for each pixel row in FIG. 2, two or more lines may be provided for each pixel row as each of the pixel drive lines 109-1 to 109-$m$. Hereinafter, in the case where the vertical signal lines 110-1 to 110-$n$ do not need to be individually distinguished from each other, they will be simply referred to as "vertical signal lines 110". In the case where the pixel drive lines 109-1 to 109-$m$ do not need to be individually distinguished from each other, they will be simply referred to as "pixel drive lines 109".

The timing control circuit 102 includes a timing generator (not shown) that generates various timing signals. The timing control circuit 102 performs drive control on the vertical scanning circuit 103, the DAC 104, the ADC group 12, the horizontal transfer scanning circuit 106, and the like on the basis of various timing signals, which are generated by the timing generator, on the basis of an externally provided control signal or the like.

The vertical scanning circuit 103 includes a shift register, an address decoder, and the like. Although illustration of a specific configuration is omitted here, the vertical scanning circuit 103 includes a reading scanning system and a sweep scanning system.

The reading scanning system performs selective scanning on unit pixels from which signals are to be read in order on a row-by-row basis. Meanwhile, the sweep scanning system performs sweep scanning of sweeping out (resetting) unnecessary charges from the photoelectric conversion elements of the unit pixels in the read row on which the read scanning is to be performed by the reading scanning system, prior to the read scanning by the amount of time corresponding to the shutter speed. By the sweeping out (resetting) of the unnecessary charges by the sweep scanning system, a so-called electronic shutter operation is performed. Here, the electronic shutter operation refers to the operation in which the optical charges of the photoelectric conversion element are discarded and exposure is newly started (accumulation of optical charges is started). The signal read by the read operation by the reading scanning system corresponds to the amount of light that has entered after the immediately preceding read operation or the electronic shutter operation. Then, the period from the read timing by the immediately preceding read operation or the sweep timing by the electronic shutter operation to the read timing by the current read operation is the accumulation time (exposure time) of the optical charges in the unit pixel.

A pixel signal VSL output from each of the unit pixels in the pixel row selectively scanned by the vertical scanning circuit 103 is supplied to the ADC group 12 via the vertical signal lines 110 in each column.

The DAC 104 generates a reference signal RAMP, which is a linearly increasing ramp-waveform signal, and supplies it to the ADC group 12.

The ADC group 12 includes ADCs 105-1, 105-2, 105-3 to 105-($n$−1), and 105-$n$ connected to the vertical signal lines 110-1, 110-2, 110-3 to 110-($n$−1), and 110-$m$. The ADCs 105-1, 105-2, 105-3 to 105-($n$−1), and 105-$n$ include comparators 121-1, 121-2, 121-3 to 121-($n$−1), and 121-$n$, counters 122-1, 122-2, 122-3 to 122-($n$−1), and 122-$n$, and latches 123-1, 123-2, 123-3 to 123-($n$−1), and 123-$n$. Note that hereinafter, in the case where the ADCs 105-1 to 105-$n$, the comparators 121-1 to 121-$n$, the counter 122-1 to the counter 122-$n$, and the latch 123-1 to the latch 123-$n$ do not need to be individually distinguished from each other, they will be respectively referred to simply as the ADCs 105, the comparators 121, the counters 122, and the latches 123.

One comparator 121, one counter 122, and one latch 123 are provided for each of the vertical signal lines 110 of the pixel unit 101, and constitute the ADC 105. That is, the ADC 105 is provided for each of the vertical signal lines 110 of the pixel unit 101 in the ADC group 12.

The comparator 121 compares the voltage of the signal obtained by adding the pixel signal VSL output from the respective pixels and the reference signal RAMP via the capacitor with a predetermined reference voltage, and supplies an output signal indicating the comparison result to the counter 122.

The counter 122 converts, by counting the time until the signal obtained by adding the pixel signal VSL and the reference signal RAMP via the capacitor exceeds the predetermined reference voltage, the analog pixel signal into a digital pixel signal represented by the count value, on the basis of the output signal of the comparator 121. The counter 122 provides the count value to the latch 123.

The latch 123 holds the count value supplied from the counter 122. Further, the latch 123 performs correlated double sampling (CDS) by taking the difference between the count value of a D phase corresponding to a pixel signal of a signal level and the count value of a P phase corresponding to a pixel signal of a reset level.

The ADCs 105-1 to 105-$n$ are arranged so as to correspond to n unit pixels Pi1 to Pin (i=1, 2, 3, to, m) arranged in one row of the unit pixels P provided in the pixel unit 101. Hereinafter, a region on the semiconductor chip allocated for disposing one ADC 105 will be referred to as a "column region". The width of the column region (the length of the unit pixel P in the row direction) is limited by the number (n) of the unit pixels P per row (in the horizontal direction) or the like. Due to the requirement for miniaturization of the image sensor 1, the width of the column region is limited. For this reason, adjacent ADCs 105 are arranged close to each other. As a result, the adjacent ADCs 105 interfere with each other, and crosstalk occurs. This crosstalk causes noise in an image or a moving image displayed on a display device or the like in some cases. In this regard, in order to reduce crosstalk, in the image sensor 1 according to this embodiment, the arrangement order of the plurality of capacitors provided in the comparators 121 differs between an even-numbered column region (example of a first region) ECA and an odd-numbered column region (example of a second region) OCA adjacent to each other. The arrangement order of the plurality of capacitors will be described below.

The horizontal transfer scanning circuit 106 includes a shift register, an address decoder, and the like, and selectively scans circuit portions corresponding to the pixel column of the ADC group 12 in order. By the selective scanning by the horizontal transfer scanning circuit 106, the digital pixel signal held in the latch 123 is sequentially transferred to the amplifier circuit 107 via a horizontal transfer line 111.

The amplifier circuit 107 amplifies the digital pixel signal supplied from the latch 123 and supplies it to the signal processing circuit 108.

The signal processing circuit 108 performs predetermined signal processing on the digital pixel signal supplied from the amplifier circuit 107, and generates two-dimensional image data. For example, the signal processing circuit 108 performs correction of vertical line imperfections and point imperfections, or clamping of signals, or performs digital signal processing such as parallel-to-serial conversion, compression, coding, addition, averaging, and an intermittent operation. The signal processing circuit 108 outputs the generated image data to the subsequent device.

<Configuration Example of Pixel>

Figure 3:
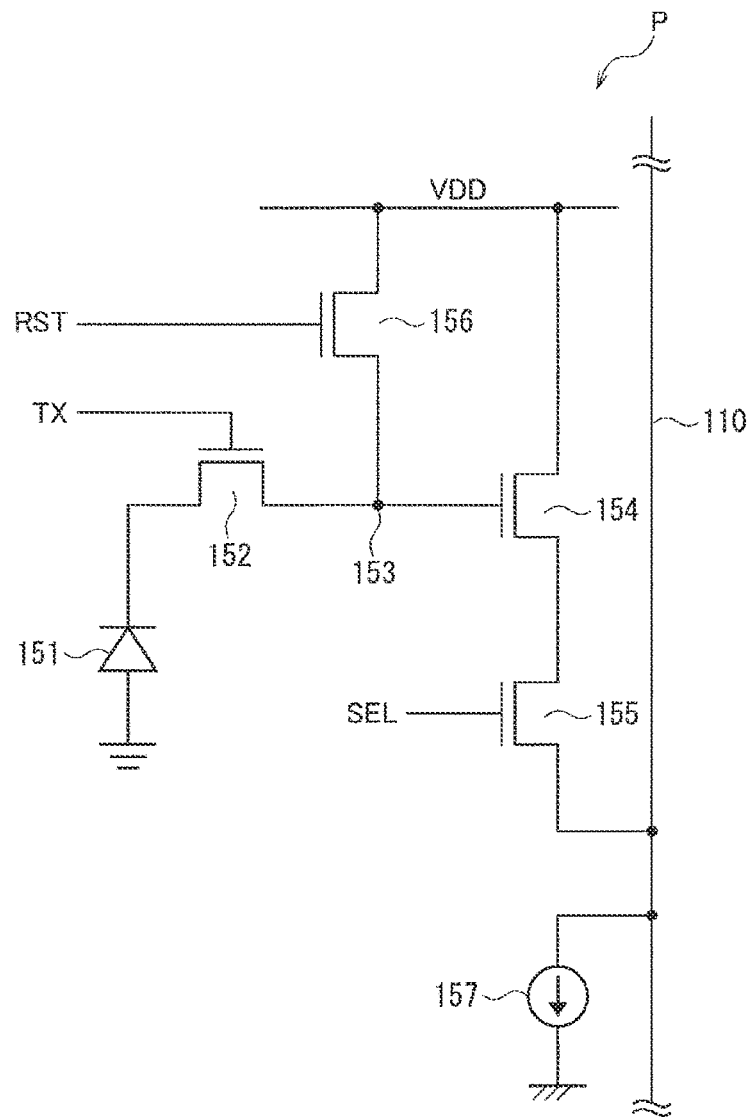
FIG. 3 is a circuit diagram showing a configuration example of a unit pixel provided in the image sensor according to the embodiment of the present technology.

FIG. 3 is a circuit diagram showing a configuration example of the unit pixels P11 to Pmn provided in the pixel unit 101. The unit pixels P11 to Pmn have the same configuration.

The unit pixel P includes, for example, a photodiode 151 as a photoelectric conversion element. The unit pixel P includes, as active elements, four transistors, i.e., a transfer transistor 152, an amplifier transistor 154, a selection transistor 155, and a reset transistor 156.

The photodiode 151 photoelectrically converts incident light into an amount of charges (here, electrons) corresponding to the amount of the incident light.

The transfer transistor 152 is connected between the photodiode 151 and an FD (floating diffusion) 153. When being turned on by a drive signal TX supplied from the vertical scanning circuit 103, the transfer transistor 152 transfers the charges accumulated in the photodiode 151 to the FD 153.

A gate of the amplifier transistor 154 is connected to the FD 153. The amplifier transistor 154 is connected to the vertical signal lines 110 via the selection transistor 155 and constitutes a source follower together with a constant current source 157 outside the pixel unit 101. When the selection transistor 155 is turned on by a drive signal SEL supplied from the vertical scanning circuit 103, the amplifier transistor 154 amplifies the potential of the FD 153 and outputs a pixel signal indicating a voltage corresponding to the potential to the vertical signal lines 110. Then, the pixel signals output from the unit pixels P are supplied to the comparators 121 of the ADC group 12 via the vertical signal lines 110.

The reset transistor 156 is connected between a power source VDD and the FD 153. When the reset transistor 156 is turned on by the driving signal RST supplied from the vertical scanning circuit 103, the potential of the FD 153 is reset to the potential of the power source VDD.

The FD 153 is formed at the connection point between the transfer transistor 152, the amplifier transistor 154, and the reset transistor 156. The transfer transistor 152, the amplifier transistor 154, the reset transistor 156, and the selection transistor 155 each include, for example, an N-type metal-oxide-semiconductor field-effect transistor (MOSFET).

<Configuration Example of Comparator>

The comparators 121 formed in the even-numbered column region ECA and the odd-numbered column region OCA have the same circuit configuration, although the arrangement of capacitors differs. For this reason, the circuit configuration of the comparator 121 will be described with reference to FIG. 4 without distinguishing the even-numbered column region ECA and the odd-numbered column region OCA from each other.

Figure 4:
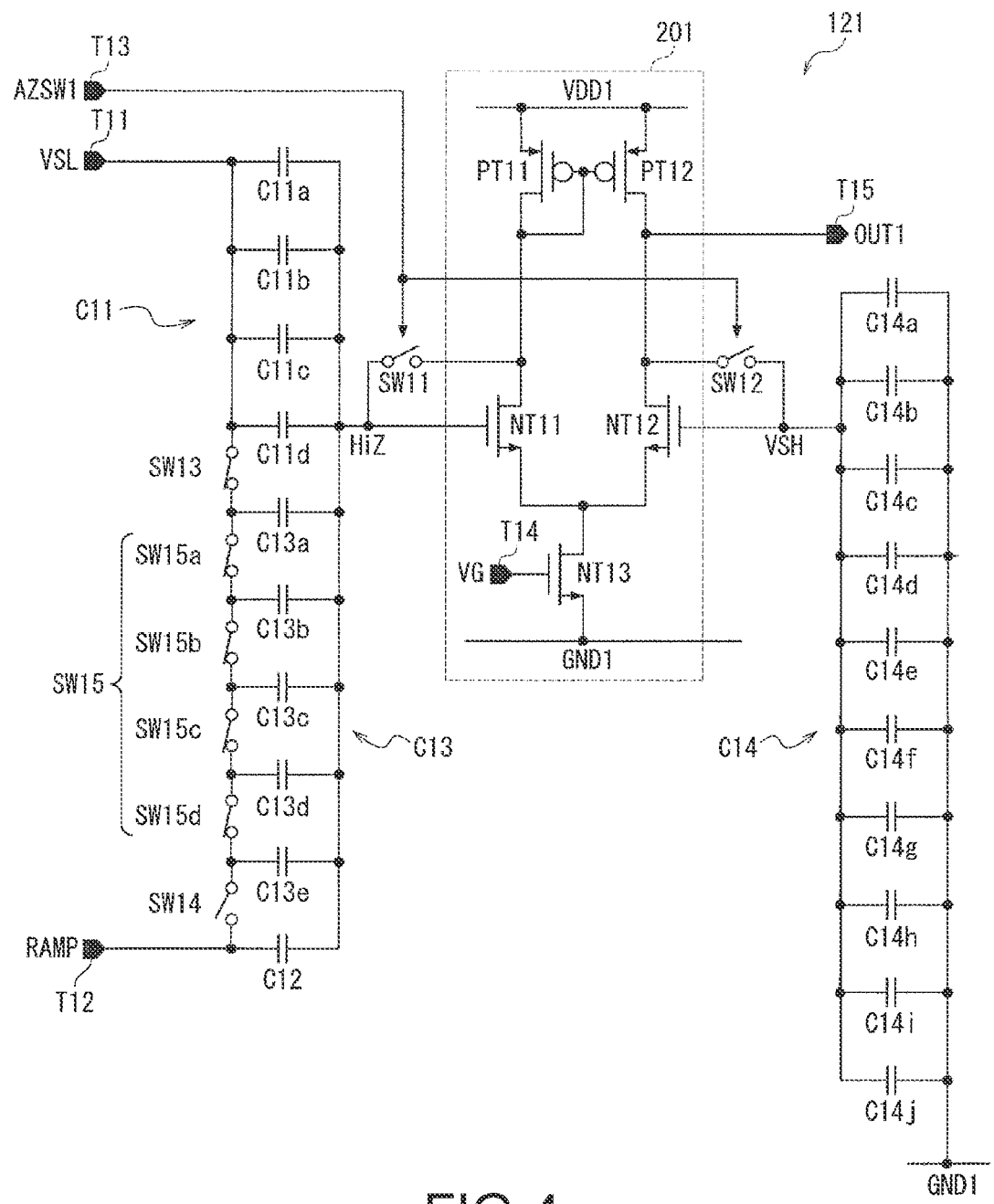
FIG. 4 is a circuit diagram showing a configuration example of a comparator provided in the image sensor according to the embodiment of the present technology.

As shown in FIG. 4, the comparator 121 includes a differential amplifier 201. The differential amplifier 201 includes a P-type MOS (PMOS) transistor PT11, a PMOS transistor PT12, and N-type MOS (NMOS) transistors NT11, NT12, and NT13. As will be described below in detail, each of the NMOS transistor NT11 and the NMOS transistor NT12 includes two split transistors connected in parallel.

A source of the PMOS transistor PT11 and a source of the PMOS transistor PT12 are connected to a power source VDD1. A drain of the PMOS transistor PT11 is connected to a gate of the PMOS transistor PT11 and to a drain of the NMOS transistor NT11. A drain of the PMOS transistor PT12 is connected to a drain of the NMOS transistor NT12 and an output terminal T15 of an output signal OUT1. A source of the NMOS transistor NT11 is connected to a source of the NMOS transistor NT12 and a drain of the NMOS transistor NT13. A source of the NMOS transistor NT13 is connected to a ground GND1.

Then, the PMOS transistor PT11 and the PMOS transistor PT12 constitute a current mirror circuit. Further, the NMOS transistor NT11, the NMOS transistor NT12, and the NMOS transistor NT13 constitute a differential comparator. That is, the NMOS transistor NT13 operates as a current source by a bias voltage VG input from the outside via an input terminal 114, and the NMOS transistor NT11 and the NMOS transistor NT12 operate as differential transistors.

The comparator 121 provided in the image sensor 1 includes a capacitor C11, a capacitor C12, a capacitor C13, and a capacitor C14.

The capacitor C11 of the comparator 121 formed in the even-numbered column region ECA corresponds to an example of a first capacitance that is connected to a first signal line connected to a first pixel including a photoelectric conversion element and disposed in a first region. In this case, unit pixels Phi (i is a natural number and an even number equal to or less than n) shown in FIG. 2 correspond to an example of a first pixel. Further, vertical signal lines 109-i (i is a natural number and an even number equal to or less than n) shown in FIG. 2 correspond to an example of a first signal line. Further, the even-numbered column region ECA shown in FIG. 2 corresponds to a first region. Further, the photodiode 151 shown in FIG. 3 corresponds to an example of a photoelectric conversion element.

The capacitor C12 of the comparator 121 formed in the even-numbered column region ECA corresponds to a second capacitance that is disposed in the even-numbered column region ECA and connected to the DAC (an example of a reference signal generation unit) 104 (see FIG. 2) that generates the reference signal RAMP. The capacitor C13 of the comparator 121 formed in the even-numbered column region ECA corresponds to an example of a third capacitance that is disposed in the even-numbered column region ECA and provided to be connectable to the capacitor C11 and the capacitor C12. The capacitor C14 of the comparator 121 formed in the even-numbered column region ECA corresponds to an example of a fourth capacitance that is disposed in the even-numbered column region ECA and connected to the ground (example of a supply unit of a reference potential) GND1.

The capacitor C11 of the comparator 121 formed in the odd-numbered column region OCA corresponds to an example of a fifth capacitance that is connected to a second signal line connected to a second pixel including a photoelectric conversion element and disposed in a second region. In this case, the unit pixels P1i (i is a natural number and an odd number equal to or less than n) shown in FIG. 2 correspond to an example of a second pixel. Further, the vertical signal lines 109-i (i is a natural number and an odd number equal to or less than n) shown in FIG. 2 correspond to an example of a second signal line. Further, the odd-numbered column region OCA shown in FIG. 2 corresponds to a second region. Further, the photodiode 151 shown in FIG. 3 corresponds to an example of a photoelectric conversion element.

The capacitor C12 of the comparator 121 formed in the odd-numbered column region OCA corresponds to a sixth capacitance that is disposed in the odd-numbered column region OCA and connected to the DAC (example of a reference signal generation unit) 104 (see FIG. 2) that generates the reference signal RAMP. The capacitor C13 of the comparator 121 formed in the odd-numbered column region OCA corresponds to an example of a seventh capacitance that is disposed in the odd-numbered column region OCA and provided to be connectable to the capacitor C11 and the capacitor C12. The capacitor C14 of the comparator 121 formed in the odd-numbered column region corresponds to an example of an eighth capacitance that is disposed in the odd-numbered column region OCA and connected to the ground GND1.

The capacitor C11 is connected between an input terminal T11 of the pixel signal VSL and a gate of the NMOS transistor NT11. The capacitor C11 is the input capacitance for the pixel signal VSL.

The capacitor C12 is connected between an input terminal T12 of the reference signal RAMP and the gate of the NMOS transistor NT11, and is the input capacitance for the reference signal RAMP.

The capacitor C13 functions as a variable capacitor for changing the capacitance value of the capacitor C11 and the capacitor C12 in accordance with the on/off states of a switch SW13 and a switch SW14. The capacitor C13 is connected between the input terminal T11 and the gate of the NMOS transistor NT11 via the capacitor C11 and the switch SW13. Further, the capacitor C13 is connected between the input terminal T12 and the gate of the NMOS transistor NT11 via the capacitor C12 and the switch SW14.

More specifically, the capacitor C11 includes split capacitors C11a, C11b, C11c, and C11d that are a plurality of (four in this embodiment) split capacitances. Each of the split capacitors C11a, C11b, C11c, and C11d includes one electrode connected to the vertical signal line 110 (see FIG. 2) via the input terminal T11, and a different electrode connected to the gate of the NMOS transistor NT11 of the differential amplifier 201. The capacitor C12 includes one electrode connected to the DAC 104 (see FIG. 2) via the input terminal T12, and a different electrode connected to the gate of the NMOS transistor NT11 of the differential amplifier 201.

The capacitor C13 includes split capacitors C13a, C13b, C13c, C13d, and C13e that are a plurality of (five in this embodiment) split capacitances. The comparator 121 includes a switch group SW15 for switching between connection and disconnection of two adjacent split capacitors of the split capacitors C13a, C13b, C13c, C13d, and C13e. More specifically, the switch group SW15 includes a switch SW15a for switching between connection and disconnection of two adjacent split capacitors C13a and C13b. The switch group SW15 includes a switch SW15b for switching between connection and disconnection of two adjacent split capacitors C13b and C13c. The switch group SW15 includes a switch SW15c for switching between connection and disconnection of two adjacent split capacitors C13c and C13d. The switch group SW15 includes a switch SW15d for switching between connection and disconnection of two adjacent split capacitors C13d and C13e.

The split capacitors C13a to C13e respectively include one electrode connected to the switches SW15a to SW15d, and a different electrode connected to the gate of the NMOS transistor NT11 of the differential amplifier 201. More specifically, the split capacitor C13a includes one electrode connected to one terminal of the switch SW15a, and a different electrode connected to the gate of the NMOS transistor NT11. One electrode of the split capacitor C13a is also connected to a different terminal of the switch SW13. One terminal of the switch SW13 is connected to one electrode of the split capacitor C11d of the capacitor C11.

The split capacitor C13b includes one electrode connected to the different terminal of the switch SW15a and one terminal of the switch SW15b, and a different electrode connected to the gate of the NMOS transistor NT11. The split capacitor C13c includes one electrode connected to the different terminal of the switch SW15b and one terminal of the switch SW15c, and a different electrode connected to the gate of the NMOS transistor NT11. The split capacitor C13d includes one electrode connected to the different terminal of the switch SW15c and one terminal of the switch SW15d, and a different electrode connected to the gate of the NMOS transistor NT11.

The split capacitor C13e includes one electrode connected to the different terminal of the switch SW15d, and a different electrode connected to the gate of the NMOS transistor NT11. One electrode of the split capacitor C13e is also connected to one terminal of a switch SW12. A different terminal of the switch SW12 is connected to one electrode of the capacitor C12.

Therefore, the switch SW13, the switches SW15a to SW15d, and the switch SW14 are subordinately connected between the one electrode of the split capacitor C11d and the one electrode of the capacitor C12.

By controlling the on/off states of the switch SW13, the switch SW14, and the switches SW15a to SW15d, the ratio of the input capacitance for the pixel signal VSL and the input capacitance for the reference signal RAMP is controlled. The switch SW13, the switch SW14, and the switches SW15a to SW15d are controlled so that at least one of them is turned off.

Hereinafter, reference symbols of the split capacitors C11a to C11d, the capacitor C12, and the split capacitors C13a to C13e are also used as reference symbols indicating respective capacitance values. The split capacitors C11a to C11d, the capacitor C12, and the split capacitors C13a to C13e are connected in parallel. An input attenuation gain Ainv for the pixel signal VSL can be expressed by the following formula (1), and an input attenuation gain Ainr for the reference signal RAMP can be expressed by the following formula (2).

$$Ainv=(C11a+C11b+C11c+C11d+C\alpha)/\Sigma C \quad (1)$$

$$Ainr=(C12+C\beta)/\Sigma C \quad (2)$$

In the formula (1) and the formula (2), "$\Sigma C$" represents the total sum of capacitance values of the split capacitors C11a to C11d, the capacitor C12, and the split capacitors C13a to C13e. Further, "$C\alpha$" in the formula (1) represents the capacitance value of the capacitor added to the pixel signal VSL side in accordance with the on/off states of the switch SW13, the switch SW14, and the switches SW15a to SW15d. Further, "$C\beta$" in the formula (2) represents the capacitance value of the capacitor added to the reference signal RAMP side in accordance with the on/off states of the switch SW13, the switch SW14, and the switches SW15a to SW15d. "$C\alpha$" in the formula (1) and "$C\beta$" in the formula (2) are as follows in accordance with the on/off states of the switch SW13, the switch SW14, and the switches SW15a to SW15d.

(A) In the case where the switch SW13 is in the off state and the switches other than the switch SW13 are in the on state:

$C\alpha=0$ $C\beta=C13a+C13b+C13c+C13d+C13e$ (B) In the case where the switch SW15a is in the off state and the switches other than the switch SW15a are in the on state:

$C\alpha=C13a$ $C\beta=C13b+C13c+C13d+C13e$ (C) In the case where the switch SW15b is in the off state and the switches other than the switch SW15b are in the on state:

$C\alpha=C13a+C13b$ $C\beta=C13c+C13d+C13e$ (D) In the case where the switch SW15c is in the off state and the switches other than the switch SW15c are in the on state:

$C\alpha=C13a+C13b+C13c$ $C\beta=C13d+C13e$ (E) In the case where the switch SW15d is in the off state and the switches other than the switch SW15d are in the on state:

$C\alpha=C13a+C13b+C13c+C13d$ $C\beta=C13e$ (F) In the case where the switch SW15e is in the off state and the switches other than the switch SW15e are in the on state:

$C\alpha=C13a+C13b+C13c+C13d+C13e$ $C\beta=0$

By switching the on/off states of the switch SW13, the switch SW14, and the switches SW15a to SW15d as described above, the input capacitance for the pixel signal VSL and the input capacitance for the reference signal RAMP can be changed in a stepwise manner.

An amplitude $\Delta$VSL of the voltage of the pixel signal VSL is $\Delta$VSL×Ainv in the gate of the NMOS transistor NT11. Therefore, as the value of "$C\alpha$" in the formula (1) becomes smaller, the amplitude of the pixel signal VSL input to the differential amplifier 201 is attenuated. As a result, the input-referred noise is increased. Meanwhile, by increasing the ratio of the input capacitance of the pixel signal VSL to the input capacitance of the reference signal RAMP, i.e., by increasing "$C\alpha$" in the formula (1) and decreasing "$C\beta$" in the formula (2), it is possible to suppress the attenuation of the pixel signal VSL input to the differential amplifier 201 and suppress the input-referred noise.

However, when the ratio of the input capacitance of the pixel signal VSL to the input capacitance of the reference signal RAMP is increased, the attenuation amount of the reference signal RAMP input to the differential amplifier 201 increases conversely.

Figure 5:
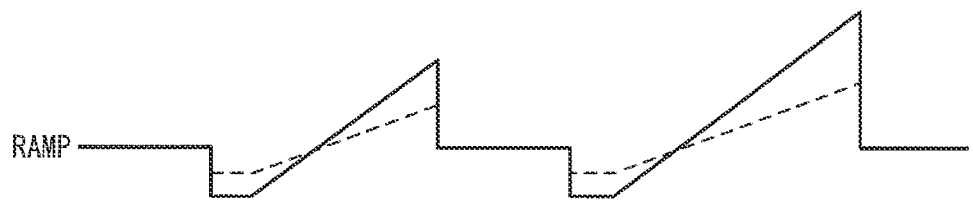
FIG. 5 is a diagram describing the comparator provided in the image sensor according to the embodiment of the present technology and is a diagram for describing a change in a reference signal input to a differential amplifier by the ratio of the input capacitance.

FIG. 5 is a diagram comparing the reference signals RAMP input to the differential amplifier 201 when the ratio of the input capacitance of the pixel signal VSL to the input capacitance of the reference signal RAMP is increased and decreased. The waveform indicated by the dotted line in FIG. 5 indicates the waveform of the reference signal RAMP input to the differential amplifier 201 in the case where the ratio is increased, and the waveform indicated by the solid line indicates the waveform of the reference signal RAMP input to the differential amplifier 201 in the case where the ratio is decreased.

As shown in FIG. 5, when the ratio of the input capacitance of the pixel signal VSL to the input capacitance of the reference signal RAMP is increased, the amplitude of the reference signal RAMP input to the differential amplifier 201 become smaller. As a result, the dynamic range of the ADC 105 is lowered.

Meanwhile, for example, it is conceivable to increase the amplitude of the reference signal RAMP input to the differential amplifier 201, and suppress a decrease in the dynamic range of the ADC 105 by increasing the amplitude of the reference signal RAMP output from the DAC 104.

However, the maximum value of the amplitude of the reference signal RAMP is limited by the specifications of the DAC 104 and the like. For example, in the high gain mode, since the amplitude of the reference signal RAMP is set to be small, the amplitude of the reference signal RAMP can be increased. Meanwhile, in the low gain mode, since the amplitude of the reference signal RAMP is set to be large in advance, it is difficult to further increase the amplitude of the reference signal RAMP in some cases.

Therefore, for example, in the high gain mode, the ratio of the input capacitance of the pixel signal VSL to the input capacitance of the reference signal RAMP is increased in the possible range, and the amplitude of the reference signal RAMP is increased. As a result, in the high gain mode susceptible to noise, it is possible to suppress the attenuation of the pixel signal VSL input to the differential amplifier 201, and suppress the influence of noise.

Meanwhile, for example, in the low gain mode, the input capacitance for the reference signal RAMP and the input capacitance for the pixel signal VSL only need to be set to values close to each other.

Returning to FIG. 4, the capacitor C14 includes split capacitors C14a, C14b, C14c, C14d, C14e, C14f, C14g, C14h, C14i, and C14j that are a plurality of (10 in this embodiment) split capacitances. Each of the split capacitors C14a, C14b, C14c, C14d, C14e, C14f, C14g, C14h, C14i, and C14j includes one electrode connected to the ground GND1, and a different electrode connected to a gate of the NMOS transistor NT12 of the differential amplifier 201. The split capacitors C14a, C14b, C14c, C14d, C14e, C14f, C14g, C14h, C14i, and C14j are connected in parallel between the ground GND1 and the gate of the NMOS transistor NT12.

In the case of the comparator 121 formed in the even-numbered column region ECA, the split capacitors C11a to C11d correspond to an example of a first split capacitance. In the case of the comparator 121 formed in the even-numbered column region ECA, the split capacitors C13a to C13d correspond to an example of a third split capacitance. In the case of the comparator 121 formed in the even-numbered column region ECA, the switch SW13 corresponds to an example of a first switching element, and the switch SW14 corresponds to an example of a second switching element. In the case of the comparator 121 formed in the even-numbered column region ECA, the switches SW15a to SW15d correspond to a third switching element.

In the case of the comparator 121 formed in the odd-numbered column region OCA, the split capacitors C11a to C11d correspond to an example of a fifth split capacitance. In the case of the comparator 121 formed in the odd-numbered column region OCA, the split capacitors C13a to C13d correspond to an example of a seventh split capacitance. In the case of the comparator 121 formed in the odd-numbered column region OCA, the switch SW13 corresponds to an example of a fifth switching element, and the switch SW14 corresponds to an example of a sixth switching element. In the case of the comparator 121 formed in the odd-numbered column region OCA, the switches SW15a to SW15d correspond to a seventh switching element.

The differential amplifier 201 includes the NMOS transistor NT11 to which the capacitor C11, the capacitor C12, and the capacitor C13 are connected, and the NMOS transistor NT12 to which the capacitor C14 is connected. Therefore, the differential amplifier 201 of the comparator 121 formed in the even-numbered column region ECA corresponds to an example of a first differential amplifier. In the case of the comparator 121 formed in the even-numbered column region ECA, the NMOS transistor NT11 corresponds to an example of one input unit provided in a first differential amplifier, and the NMOS transistor NT12 corresponds to an example of a different input unit provided in the first differential amplifier. Meanwhile, the differential amplifier 201 of the comparator 121 formed in the odd-numbered column region OCA corresponds to an example of a second differential amplifier. In the case of the comparator 121 formed in the odd-numbered column region OCA, the NMOS transistor NT11 corresponds to an example of one input unit provided in a second differential amplifier, and the NMOS transistor NT12 corresponds to an example of a different input unit provided in the second differential amplifier.

A switch SW11 is connected between the drain-gate of the NMOS transistor NT11. The switch SW11 is switched from the on state to the off state or from the off state to the on state by a drive signal AZSW1 input from the timing control circuit 102 via an input terminal T13.

The switch SW12 is connected between the drain-gate of the NMOS transistor NT12. The switch SW12 is switched from the on state to the off state or from the off state to the on state by the drive signal AZSW1 input from the timing control circuit 102 via the input terminal T13.

Note that hereinafter, a connection point between the capacitor C11, the capacitor C12, the capacitor C13, and the switch SW11 will be referred to as a node HiZ. Further, hereinafter, a connection point between the gate of the NMOS transistor NT12, the capacitor C13, and the switch SW12 will be referred to as a node VSH.

Figure 6:
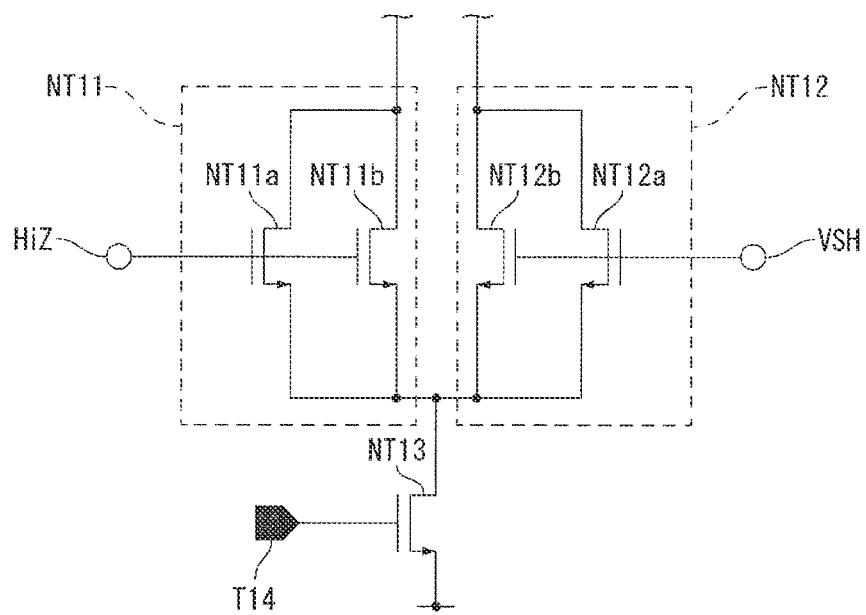
FIG. 6 is a diagram showing a schematic configuration of two NMOS transistors constituting a differential pair of the comparator provided in the image sensor according to the embodiment of the present technology.

As shown in FIG. 6, the NMOS transistor NT11 includes two split transistors NT11a and NT11b connected in parallel. Each of the split transistor NT11a and the split transistor NT11b includes an NMOSFET. A source of the split transistor NT11a and a source of the split transistor NT11b are connected to each other. A drain of the split transistor NT11a and a drain of the split transistor NT11b are connected to each other. A gate of the split transistor NT11a and a drain of the split transistor NT11b are connected to each other. The respective sources of the split transistors NT11a and NT11b are connected to the drain of the NMOS transistor NT13. Each of the drains of the split transistors NT11a and NT11b is connected to the drain and gate of the PMOS transistor PT11 (see FIG. 4), a gate of the PMOS transistor PT12 (see FIG. 4), and the switch SW11 (see FIG. 4).

The NMOS transistor NT12 includes two split transistors NT12a and NT12b connected in parallel. Each of the split transistor NT12a and the split transistor NT12b includes an NMOSFET. A source of the split transistor NT12a and a source of the split transistor NT12b are connected to each other. A drain of the split transistor NT12a and a drain of the split transistor NT12b are connected to each other. A gate of the split transistor NT12a and the drain of the split transistor NT12b are connected to each other. The respective sources of the split transistors NT12a and NT12b are connected to the drain of the NMOS transistor NT13. Each of the drains of the split transistors NT12a and NT12b is connected to the drain of the PMOS transistor PT12, the switch SW12, and an output terminal OUT (see FIG. 4).

Next, an example of an arrangement relationship of the capacitors, the NMOS transistor NT11, and the NMOS transistor NT12 of the comparator 121 formed in the odd-numbered column region OCA and the even-numbered column region ECA will be described with reference to FIG. 7.

Figure 7:
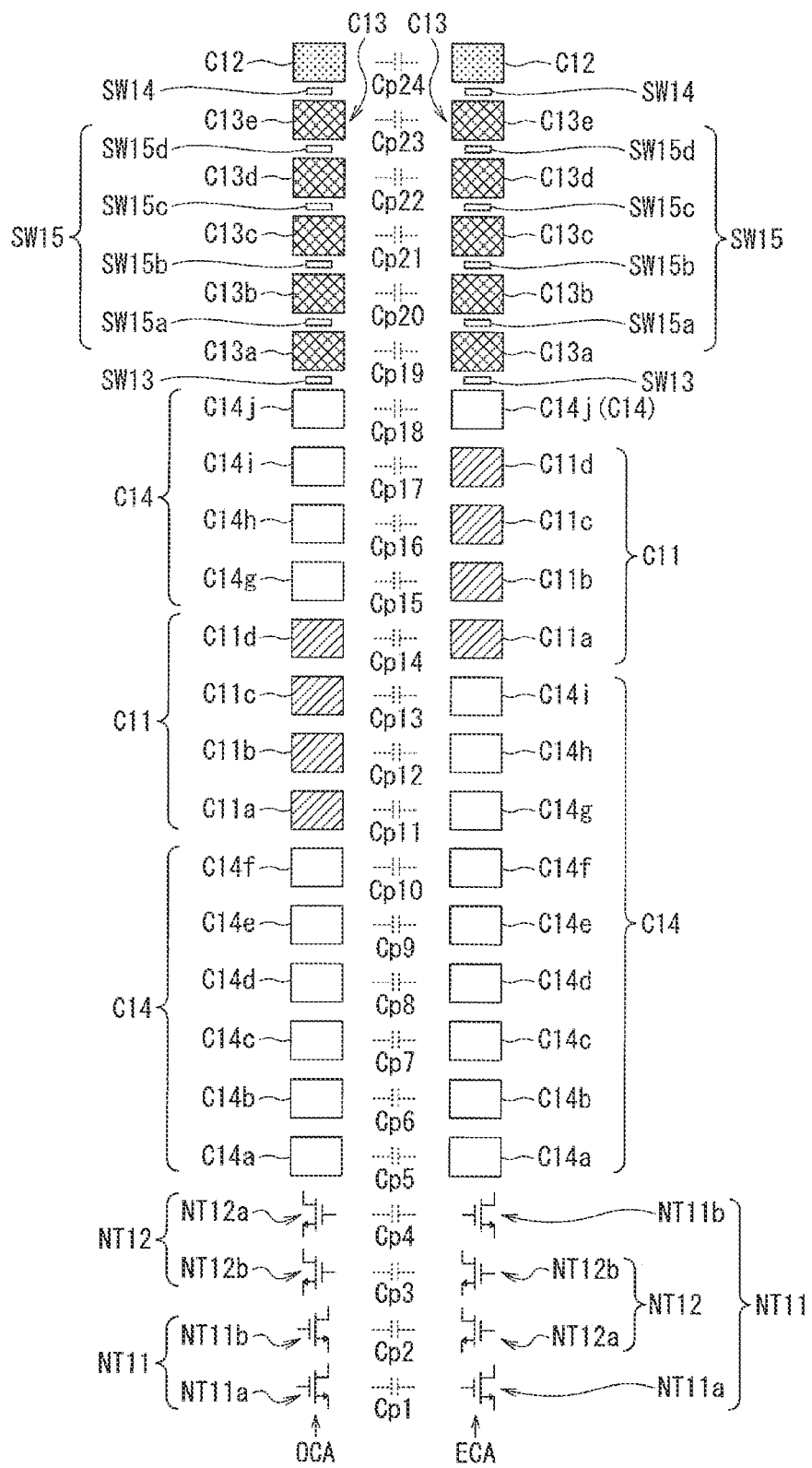
FIG. 7 is a diagram describing the image sensor according to the embodiment of the present technology and is a diagram showing an example of an arrangement relationship of capacitors and NMOS transistors constituting the differential pairs of comparators formed in an odd-numbered column region and an even-numbered column region.

As shown in FIG. 7, in the even-numbered column region ECA, the capacitor C12 and the capacitor C13 are arranged facing each other with the switch SW14 interposed therebetween. The split capacitors C13a to C13e that are split capacitances of the capacitor C13 are aggregated within a predetermined range of the even-numbered column region ECA. More specifically, the capacitor C12 and the split capacitor C13e are arranged facing each other with the switch SW14 interposed therebetween. The split capacitor C13e, the split capacitor C13d, the split capacitor C13c, the split capacitor C13b, and the split capacitor C13a are arranged side by side in the stated order from the side where the capacitor C12 is disposed. A switch SW13d is disposed between the split capacitor C13e and the split capacitor C13d. A switch SW13c is disposed between the split capacitor C13d and the split capacitor C13c. A switch SW13b is disposed between the split capacitor C13c and the split capacitor C13b. A switch SW13a is disposed between the split capacitor C13b and the split capacitor C13a.

In the even-numbered column region ECA, a split capacitor C14j that is a split capacitance of the capacitor C14 is disposed adjacent to the split capacitor C13a on the side where the split capacitor C13b is not disposed with the switch SW13 interposed therebetween. By arranging the split capacitors C13a to C13e, the switches SW15a to SW15d, the switch SW14, and the switch SW13 to be aggregated within a predetermined range, the complexity of the wiring and the parasitic capacitance generated between the respective elements can be suppressed.

In the even-numbered column region ECA, the capacitor C11 is disposed adjacent to the split capacitor C14j on the side where the split capacitor C13a is not disposed. More specifically, the split capacitor C11d, the split capacitor C11c, the split capacitor C11b, and the split capacitor C11a that are split capacitances of the capacitor C11 are arranged side by side in the stated order from the side where the split capacitor C14j is disposed.

In the even-numbered column region ECA, the remainders of the capacitor C14, which are split capacitances of the capacitor C14, are arranged adjacent to the split capacitor C11a on the side where the split capacitor C11b is not disposed. More specifically, the remaining split capacitor C14i, the split capacitor C14h, the split capacitor C14g, the split capacitor C14f, the split capacitor C14e, the split capacitor C14d, the split capacitor C14c, the split capacitor C14b, and the split capacitor C14a of the capacitor C14 are arranged side by side in the stated order from the side where the split capacitor C11a is disposed.

In the even-numbered column region ECA, the NMOS transistor NT11 and the NMOS transistor NT12 are arranged adjacent to the split capacitor C14a on the side where the split capacitor C14b is not disposed. More specifically, the split transistor NT11b, the split transistor NT12b, the split transistor NT12a, and the split transistor NT11a are arranged side by side in the stated order from the side where the split capacitor C14a is disposed.

Thus, in the even-numbered column region ECA, the capacitors C11 to C14, the switch SW13, the switch group SW15, the NMOS transistor NT11, and the NMOS transistor NT12 are arranged, for example, on a straight line.

As shown in FIG. 7, in the odd-numbered column region OCA, the capacitor C12 and the capacitor C13 are arranged facing each other with the switch SW14 interposed therebetween. The split capacitors C13a to C13e that are split capacitances of the capacitor C13 are aggregated within a predetermined range of the odd-numbered column region OCA. More specifically, the capacitor C12 and the split capacitor C13e are arranged facing each other with the switch SW14 interposed therebetween. The split capacitor C13e, the split capacitor C13d, the split capacitor C13c, the split capacitor C13b, and the split capacitor C13a are arranged side by side in the stated order from the side where the capacitor C12 is disposed. A switch SW13d is disposed between the split capacitor C13e and the split capacitor C13d. A switch SW13c is disposed between the split capacitor C13d and the split capacitor C13c. A switch SW13b is disposed between the split capacitor C13c and the split capacitor C13b. A switch SW13a is disposed between the split capacitor C13b and the split capacitor C13a.

In the odd-numbered column region OCA, a part of split capacitances of the capacitor C14 is disposed adjacent to the split capacitor C13a on the side where the split capacitor C13b is not disposed with the switch SW13 interposed therebetween. By arranging the split capacitors C13a to C13e, the switches SW15a to SW15d, the switch SW14, and the switch SW13 to be aggregated within a predetermined range as described above, the complexity of the wiring and the parasitic capacitance generated between the respective elements can be suppressed.

More specifically, in the odd-numbered column region OCA, the split capacitor C14j, the split capacitor C14i, the split capacitor C14h, and the split capacitor C14g that are split capacitances of the capacitor C14 are arranged side by side in the stated order from the side where the split capacitor C13a is disposed.

In the odd-numbered column region OCA, the capacitor C11 is disposed adjacent to the split capacitor C14g on the side where the split capacitor C14h is not disposed. More specifically, the split capacitor C11d, the split capacitor C11c, the split capacitor C11b, and the split capacitor C11a that are split capacitances of the capacitor C11 are arranged side by side in the stated order from the side where the split capacitor C14g is disposed.

In the odd-numbered column region OCA, the remaining split capacitances of the capacitor C14 are arranged adjacent to the split capacitor C11a on the side where the split capacitor C11b is not disposed. More specifically, the split capacitor C14f, the split capacitor C14e, the split capacitor C14d, the split capacitor C14c, the split capacitor C14b, and the split capacitor C14a, which are the remainders of the capacitor C14, are arranged side by side in the stated order from the side where the split capacitor C11a is disposed.

In the odd-numbered column region OCA, the NMOS transistor NT11 and the NMOS transistor NT12 are arranged adjacent to the split capacitor C14a on the side where the split capacitor C14b is not disposed. More specifically, the split transistor NT12a, the split transistor NT12b, the split transistor NT11b, and the split transistor NT11a are arranged side by side in the stated order from the side where the split capacitor C14a is disposed.

Thus, in the odd-numbered column region OCA, the capacitors C11 to C14, the switch SW13, the switch group SW15, the NMOS transistor NT11, and the NMO As shown in FIG. 7, in the even-numbered column region ECA, the number of the split capacitors C11a to C11d is 4, the number of the capacitors C12 is 1, the number of the split capacitors C13a to C13e is 5, and the number of the split capacitors C14a to C14j is 10. Therefore, in the even-numbered column region ECA, the total number (10) of the split capacitors C11a to C11d (example of a first split capacitance), the capacitors C12 (example of a second capacitance), and the split capacitors C13a to C13e (example of a third split capacitance) is the same as the total number of the split capacitors C14a to C14j (example of a fourth split capacitance).

Further, in the odd-numbered column region OCA, the number of the split capacitors C11a to C11d is 4, the number of the capacitors C12 is 1, the number of the split capacitors C13a to C13e is 5, and the number of the split capacitors C14a to C14j is 10. Therefore, in the odd-numbered column region OCA, the total number (10) of the split capacitors C11a to C11d (example of a fifth split capacitance), the capacitors C12 (example of a sixth capacitance), and the split capacitors C13a to C13e (example of a seventh split capacitance) is the same as the total number of the split capacitors C14a to C14j (example of an eighth capacitance).

The total number (20) of the split capacitors C11a to C11d, the capacitors C12, the split capacitors C13a to C13e, and the split capacitors C14a to C14j in the even-numbered column region ECA is the same as the total number (20) of the split capacitors C11a to C11d, the capacitors C12, the split capacitors C13a to C13e, and the split capacitors C14a to C14j in the odd-numbered column region OCA.

Each of the split capacitors C11a to C11d, the capacitor C12, each of the split capacitors C13a to C13e, and each of the split capacitors C14a to C14j in the even-numbered column region ECA and each of the split capacitors C11a to C11d, the capacitor C12, each of the split capacitors C13a to C13e, and each of the split capacitors C14a to C14j in the odd-numbered column region OCA have the same capacitance value.

Thus, the input capacitance connected to the NMOS transistor NT11 and the NMOS transistor NT12 including the differential pair of the differential amplifier 201 is split into the same number of capacitors. As a result, the capacitance connected to the differential pair of the differential amplifier 201 is balanced. Further, variations in the power source VDD1 can be caused to affect the differential pair of the differential amplifier 201 equally. As a result, the power supply rejection ratio (PSRR) is improved. In addition, voltage variations based on leakage currents occurring in the switch SW11 and the switch SW12 provided in the comparator 121 can be made identical in the NMOS transistor NT11 and the NMOS transistor NT12. As a result, the image sensor 1 is capable of preventing the leakage current from affecting the comparing operation by the comparator 121.

The even-numbered column region ECA and the odd-numbered column region OCA are arranged adjacent to each other due to the limitation of the size of the semiconductor chip on which the image sensor 1 is formed. Therefore, a parasitic capacitance is generated between each element formed in the even-numbered column region ECA and each element formed in the odd-numbered column region OCA.

As shown in FIG. 7, a parasitic capacitance Cp1 is generated between a gate of the split transistor NT11a in the even-numbered column region ECA and a gate of the split transistor NT11a in the odd-numbered column region OCA. A parasitic capacitance Cp1 is generated between a gate of the split transistor NT12a in the even-numbered column region ECA and a gate of the split transistor NT11b in the odd-numbered column region OCA. A parasitic capacitance Cp3 is generated between a gate of the split transistor NT12b in the even-numbered column region ECA and a gate of the split transistor NT12b in the odd-numbered column region OCA. A parasitic capacitance Cp4 is generated between a gate of the split transistor NT11b in the even-numbered column region ECA and a gate of the split transistor NT12a in the odd-numbered column region OCA.

A parasitic capacitance Cp5 is generated between the split capacitor C14a in the even-numbered column region ECA and the split capacitor C14a in the odd-numbered column region OCA. A parasitic capacitance Cp6 is generated between the split capacitor C14b in the even-numbered column region ECA and the split capacitor C14b in the odd-numbered column region OCA. A parasitic capacitance Cp1 is generated between the split capacitor C14c in the even-numbered column region ECA and the split capacitor C14c in the odd-numbered column region OCA. A parasitic capacitance Cp8 is generated between the split capacitor C14d in the even-numbered column region ECA and the split capacitor C14d in the odd-numbered column region OCA. A parasitic capacitance Cp9 is generated between the split capacitor C14e in the even-numbered column region ECA and the split capacitor C14e in the odd-numbered column region OCA. A parasitic capacitance Cp10 is generated between the split capacitor C14f in the even-numbered column region ECA and the split capacitor C14f in the odd-numbered column region OCA.

A parasitic capacitance Cp11 is generated between the split capacitor C14g in the even-numbered column region ECA and the split capacitor C11a in the odd-numbered column region OCA. A parasitic capacitance Cp12 is generated between the split capacitor C14h in the even-numbered column region ECA and the split capacitor C11b in the odd-numbered column region OCA. A parasitic capacitance Cp13 is generated between the split capacitor C14i in the even-numbered column region ECA and the split capacitor C11c in the odd-numbered column region OCA. A parasitic capacitance Cp14 is generated between the split capacitor C11a in the even-numbered column region ECA and the split capacitor C11d in the odd-numbered column region OCA.

A parasitic capacitance Cp15 is generated between the split capacitor C11b in the even-numbered column region ECA and the split capacitor C14g in the odd-numbered column region OCA. A parasitic capacitance Cp16 is generated between the split capacitor C11c in the even-numbered column region ECA and the split capacitor C14h in the odd-numbered column region OCA. A parasitic capacitance Cp17 is generated between the split capacitor C11d in the even-numbered column region ECA and the split capacitor C14i in the odd-numbered column region OCA. A parasitic capacitance Cp18 is generated between the split capacitor C14j in the even-numbered column region ECA and the split capacitor C14j in the odd-numbered column region OCA.

A parasitic capacitance Cp19 is generated between the split capacitor C13a in the even-numbered column region ECA and the split capacitor C13a in the odd-numbered column region OCA. A parasitic capacitance Cp20 is generated between the split capacitor C13b in the even-numbered column region ECA and the split capacitor C13b in the odd-numbered column region OCA. A parasitic capacitance Cp21 is generated between the split capacitor C13c in the even-numbered column region ECA and the split capacitor C13c in the odd-numbered column region OCA. A parasitic capacitance Cp22 is generated between the split capacitor C13d in the even-numbered column region ECA and the split capacitor C13d in the odd-numbered column region OCA. A parasitic capacitance Cp23 is generated between the split capacitor C13e in the even-numbered column region ECA and the split capacitor C13e in the odd-numbered column region OCA. A parasitic capacitance Cp24 is generated between the capacitor C12 in the even-numbered column region ECA and the capacitor C12 in the odd-numbered column region OCA.

Incidentally, for example, assumption is made that a large-amplitude aggressor from the pixel signal VSL in the odd-numbered column region OCA unequally interferes with the right and left capacitances of a differential pair of the differential amplifier 201 provided in the even-numbered column region ECA that is an adjacent column. In this case, the aggressor is not canceled by the differential pair of the differential amplifier 201 and leads to image quality degradation as crosstalk. In the comparators 121 provided in the image sensor 1 according to this embodiment, the capacitor C13 that functions as a switching capacitance acts as the input capacitance for the pixel signal VSL or as the input capacitance for the reference signal RAMP. For this reason, it is very difficult to perfectly balance the right and left capacitances of the differential pair of the differential amplifier 201 with the large-amplitude aggressor from the pixel signal VSL in an adjacent column at all times.

In view of the above, in the image sensor 1 according to this embodiment, the arrangement of the capacitances of the differential pair of the differential amplifier 201 differs between the even-numbered column region ECA and the odd-numbered column region OCA. As a result, no matter how all or a part of the capacitors C13 that function as the switching capacitances is added as the input capacitance for the pixel signal VSL and the reference signal RAMP, the absolute value of the interference imbalance of the large-amplitude aggressor of the adjacent pixel signal VSL is not prominently large for the differential pair of the differential amplifier 201.

More specifically, the split capacitors C11a to C11d (example of a fifth split capacitance) in the odd-numbered column region OCA are arranged so that the number of split capacitors facing the split capacitors C11a to C11d (example of a first split capacitance) in the even-numbered column region ECA and the number of split capacitors facing the split capacitors C14a to C14j (example of a fourth split capacitance) in the even-numbered column region ECA differs. In the configuration example shown in FIG. 7, three split capacitors C11a to C11c of the split capacitors C11a to C11d in the odd-numbered column region OCA are arranged facing the split capacitors C14g to C14i connected to the NMOS transistor NT12 in the even-numbered column region ECA. Further, one split capacitor C11d of the split capacitors C11a to C11d in the odd-numbered column region OCA is disposed facing the split capacitor C11a connected to the NMOS transistor NT11 in the even-numbered column region ECA.

The split capacitors C11a to C11d, the capacitor C12, and the split capacitors C13a to C13e are connected in parallel. Further, the split capacitors C14a to C14j are connected in parallel. Therefore, the number of split capacitors facing each other can also be viewed as the area in which the capacitors including the split capacitors face each other. Therefore, the capacitor C11 (an example of a fifth capacitance) in the odd-numbered column region OCA is disposed facing the capacitor C11 (example of a first capacitance) and the capacitor C14 (example of a fourth capacitance) in the even-numbered column region ECA with different areas. The operation and effects of making the arrangement of a plurality of capacitors different between the even-numbered column region ECA and the odd-numbered column region OCA will be described below in detail.

<Operation of Comparator>

Figure 8:
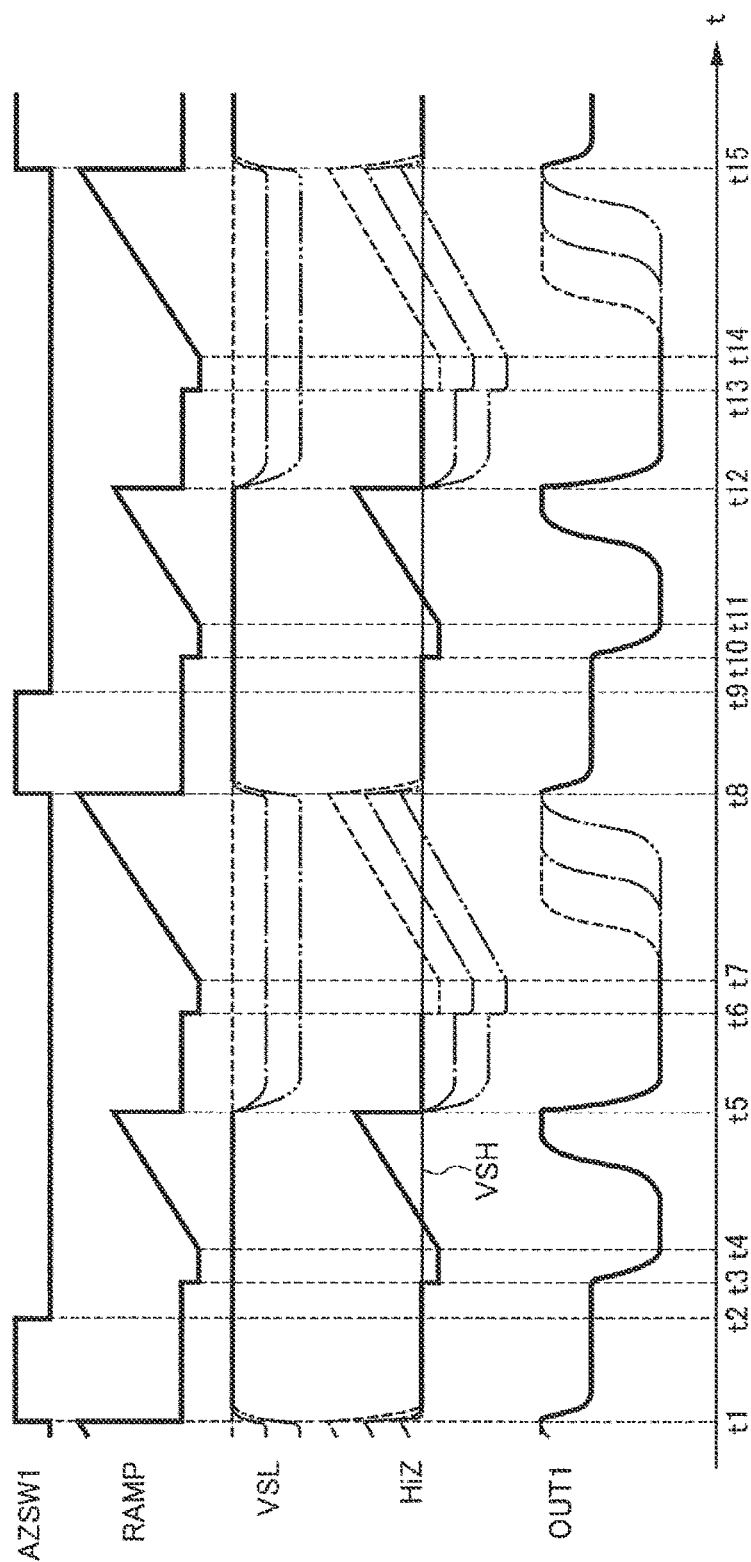
FIG. 8 is a timing chart for describing an operation of the comparator provided in the image sensor according to the embodiment of the present technology.
Figure 9:
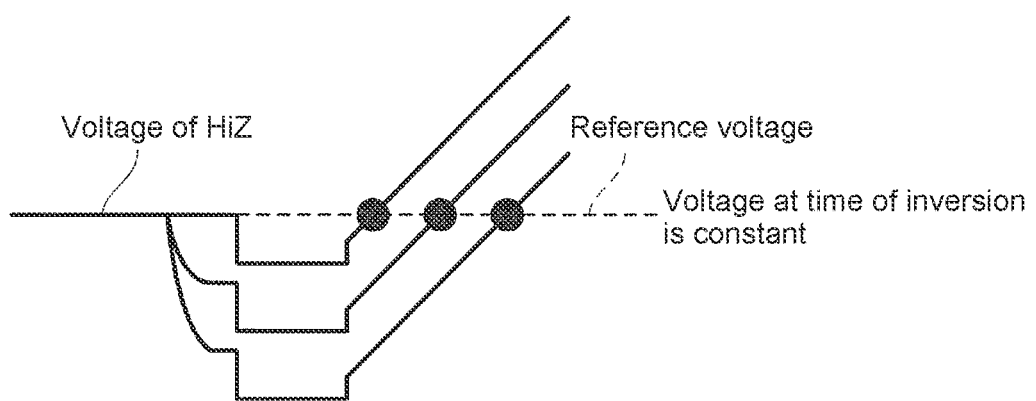
FIG. 9 is a diagram for describing the effects of the comparator provided in the image sensor according to the embodiment of the present technology.

Next, the operation of the comparators 121 will be described with reference to the timing charts of FIG. 8 and FIG. 9. FIG. 8 shows a timing chart of the drive signal AZSW1, the reference signal RAMP, the pixel signal VSL, the node VSH, the node HiZ, and the output signal OUT1. FIG. 9 shows an example of waveforms of the node HiZ from a time t5 to a time t8 shown in FIG. 8.

At a time t1, the drive signal AZSW1 is set to a high level. Although not shown, at substantially the same time as the drive signal AZSW1 is set to the high level, one switch of the switch SW13, the switch SW14, and switches 15a to 15d is set to the off state, and the remaining switches are set to the on state on the basis of the gain at the time of imaging in the image sensor 1. In this embodiment, six gain modes can be supported. In the case of the gain mode of the lowest level of the six gain modes, the switch SW13 is set to the off state. Further, in the case of the gain mode of the second lowest level, the switch SW15a is set to the off state. Further, in the case of gain mode of the third lowest level, the switch SW15b is set to the off state. Further, in the case of the gain mode of the fourth lowest level, the switch SW15c is set to the off state. Further, in the case of the gain mode of the fifth lowest level, the switch SW15d is set to the off state. Further, in the case of the gain mode of the sixth lowest level, i.e., the highest level, the switch SW14 is set to the off state.

Then, the switch SW11 and the switch SW12 are turned on, and the drain and gate of the NMOS transistor NT11 and the drain and gate of the NMOS transistor NT12 are connected to each other. Further, the reference signal RAMP is set to a predetermined reset level. Further, the FD 153 of the unit pixel P to be read is reset, and the pixel signal VSL is set to the reset level.

Thus, an auto-zero operation of the differential amplifier 201 is started. That is, the drain and gate of the NMOS transistor NT11 and the drain and gate of the NMOS transistor NT12 converge to the same predetermined voltage (hereinafter, referred to as the reference voltage). As a result, the voltages of the node HiZ and the node VSH are set to the reference voltage.

Next, at a time t2, the drive signal AZSW1 is set to a low level, and the switch SW11 and the switch SW12 are turned off. Thus, the auto-zero operation of the differential amplifier 201 is finished. The voltage of the node HiZ is held at the reference voltage because the pixel signal VSL and the reference signal RAMP do not change. Further, the voltage of the node VSH is held at the reference voltage by charges accumulated in the capacitor C14.

At a time t3, the voltage of the reference signal RAMP is lowered from the reset level by a predetermined value. As a result, the voltage of the node HiZ is reduced below the voltage of the node VSH (reference voltage), and the output signal OUT1 of the differential amplifier 201 becomes a low level.

At a time t4, the reference signal RAMP begins to increase. Along with this, the voltage of the node HiZ also increases. Further, the counter 122 starts counting.

After that, when the voltage of the node HiZ exceeds the voltage (reference voltage) of the node VSH, the output signal OUT1 of the differential amplifier 201 is inverted and becomes a high level. Then, the count value of the counter 122 when the output signal OUT1 is inverted to the high level is held in the latch 123 as the value of the pixel signal VSL of the P phase (reset level).

At a time t5, the voltage of the reference signal RAMP is set to the reset voltage. Further, the transfer transistor 152 of the unit pixel P is turned on, charges accumulated in the photodiode 151 during the exposure are transferred to the FD 153, and the pixel signal VSL is set to the signal level. As a result, the voltage of the node HiZ is reduced by a value corresponding to the signal level to be below the voltage (reference voltage) of the node VSH, and the output signal OUT1 of the differential amplifier 201 is inverted to a low level.

At a time t6, similarly to the time t3, the voltage of the reference signal RAMP is lowered from the reset level by a predetermined value. As a result, the voltage of the node HiZ is further reduced.

At a time t7, the reference signal RAMP begins to increase, similarly to the time t4. Along with this, the voltage of the node HiZ voltage increases linearly. Further, the counters 122 starts counting.

After that, when the voltage of the node HiZ exceeds the voltage (reference voltage) of the node VSH, the output signal OUT1 of the differential amplifier 201 is inverted and becomes a high level. Then, the count value of the counters 122 when the output signal OUT1 is inverted to the high level is held in the latch 123 as the value of the pixel signal VSL of the D phase (signal level). Further, the latch 123 performs correlated double sampling by taking the difference between the pixel signal VSL of the D phase and the pixel signal VSL of the P phase read between the time t4 and the time t5. In this manner, the pixel signal VSL is AD-converted.

After that, the same operation as that performed from the time t1 to the time t7 is repeated after the time t8. Note that even after the time t8, at substantially the same time as the drive signal AZSW1 is set to the high level, one switch of the switch SW13, the switch SW14, and the switches 15a to 15d is set to the off state, and the remaining switches are set to the on state on the basis of the gain at the time of imaging in the image sensor 1.

This lowers the voltage of the power source VDD1 and reduces the power consumption of the ADC group 12. As a result, it is possible to reduce the power consumption of the image sensor 1.

In the existing comparator in which an image signal is input to one of a differential pair of a differential amplifier and a reference signal is input to the other of the differential pair, a reference signal and a pixel signal are compared, and the comparison result is output as an output signal. At this time, the input voltage (voltages of the reference signal and the pixel signal) of the differential amplifier at the time of inversion of the output signal varies with the voltage of the pixel signal. Therefore, for example, when the voltage of the power source for driving the comparator according to the existing technology is lowered, there is a possibility that the input voltage of the differential amplifier at the time of inversion of the output signal exceeds the input dynamic range of the comparator, and the linearity of the AD conversion cannot be ensured.

In contrast, in the comparators 121 according to this embodiment, the comparison result between the voltage (voltage of the node HiZ) of the signal obtained by adding the pixel signal VSL and the reference signal RAMP via the input capacitance and the voltage (reference voltage) of the node VSH is output as the output signal OUT1 as described above. At this time, as shown in FIG. 9, the input voltage (voltages of the node HiZ and the node VSH) of the differential amplifier 201 at the time of inversion of the output signal OUT1 is constant without variation.

Further, in the image sensor 1, the direction in which the reference signal RAMP changes is opposite to the reference signal of the comparator according to the existing technology and changes in the direction opposite to the pixel signal VSL. Here, changing in the direction opposite to the pixel signal VSL means changing in the direction opposite to the direction in which the pixel signal VSL changes as the signal components increase. For example, in this example, the pixel signal VSL changes in the negative direction as the signal components increase, while the reference signal RAMP changes in the positive direction opposite thereto. Therefore, the voltage (input voltage of the differential amplifier 201) of the node HiZ is a voltage corresponding to the difference between the pixel signal VSL and the reference signal in the existing technology.

In this manner, since the input voltage of the differential amplifier 201 at the time of inversion of the output signal OUT1 become constant, the input dynamic range of the differential amplifier 201 can be narrowed.

Therefore, the voltage of the power source VDD1 for driving the comparator 121 can be reduced below that of the comparator according to the existing technology, resulting in a reduction in the power consumption of the ADC group 12 and a reduction in the power consumption of the image sensor 1.

Figure 10:
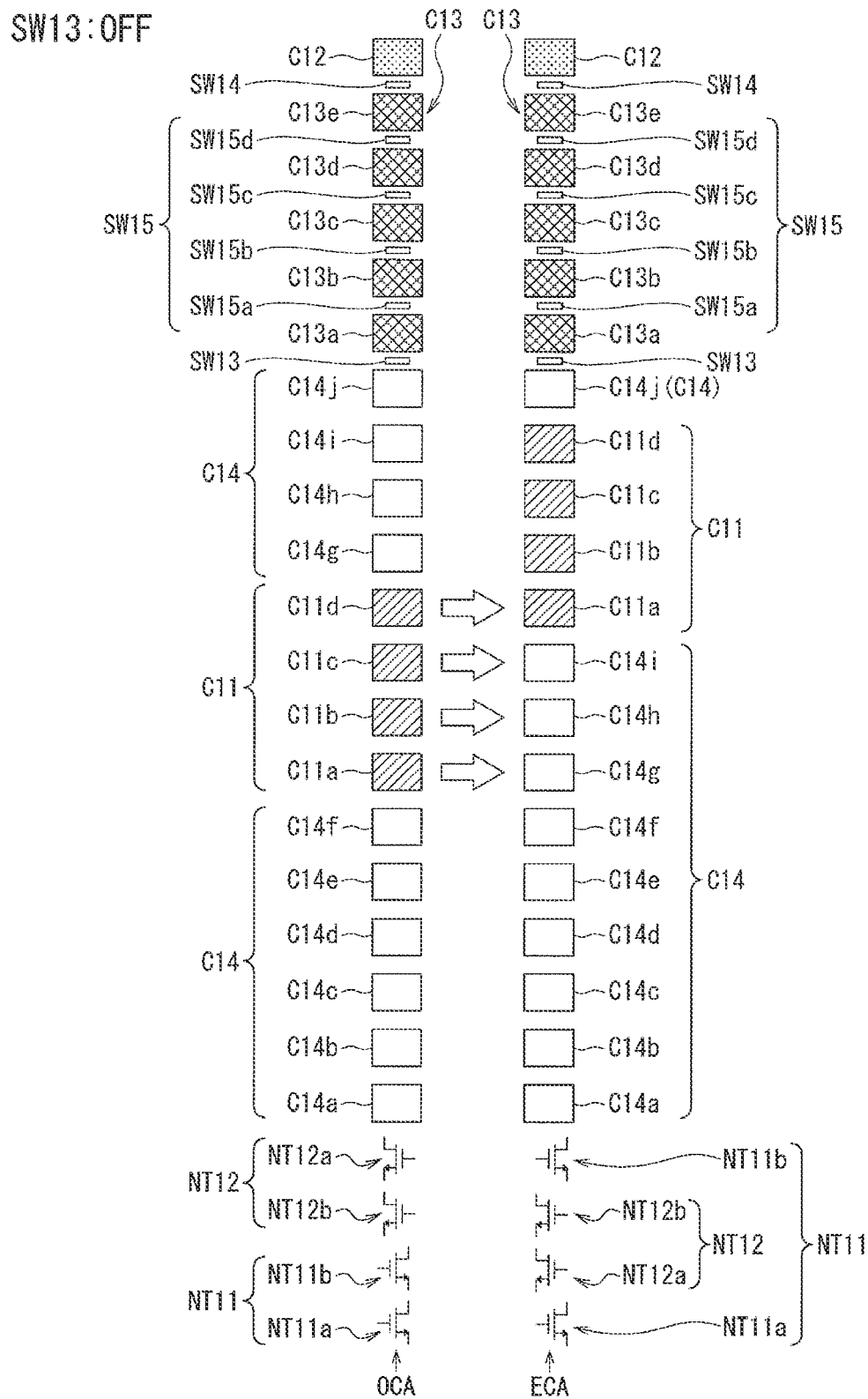
FIG. 10 is a diagram describing the operation and effects of the image sensor according to the embodiment of the present technology (first interference example).
Figure 11:
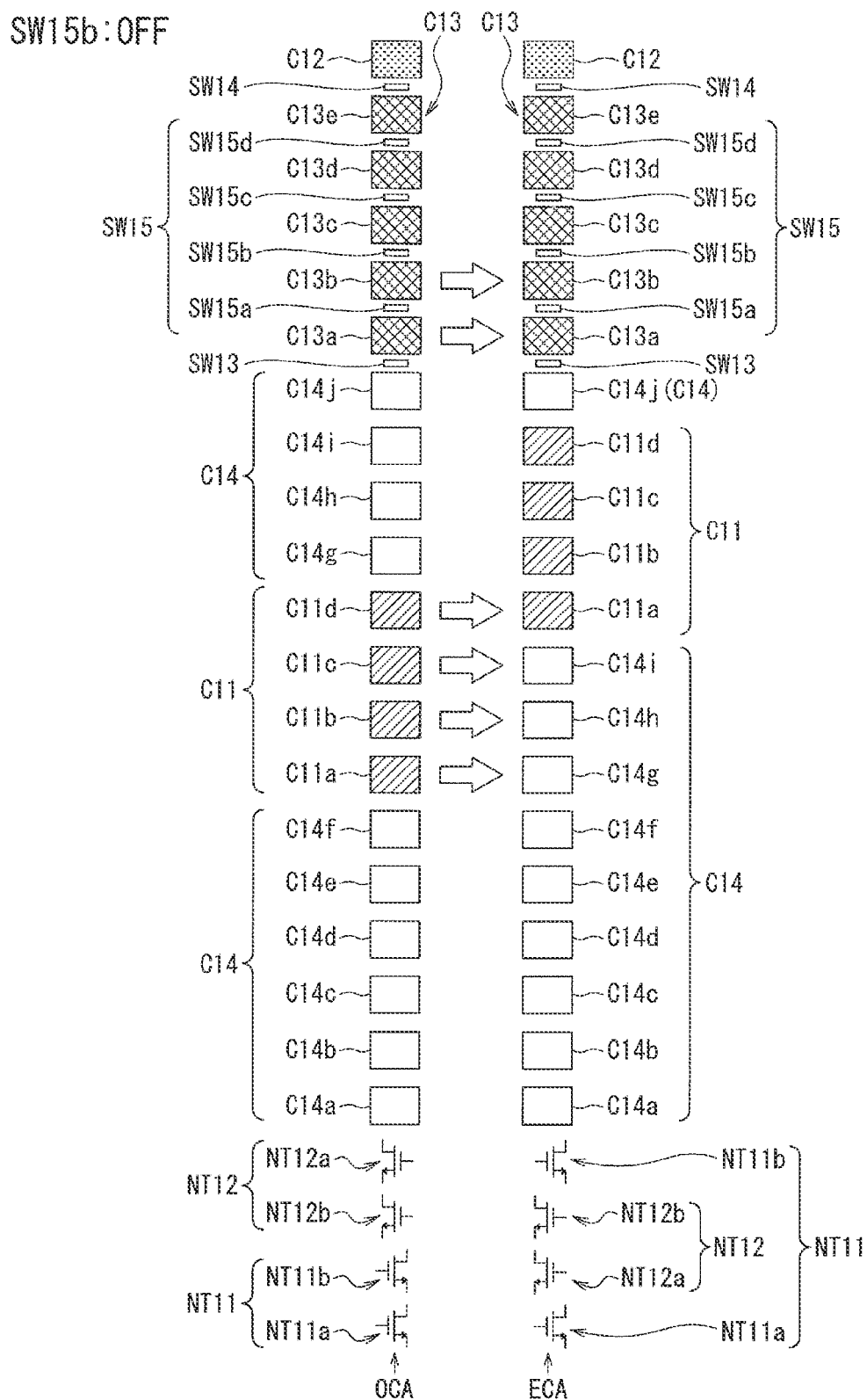
FIG. 11 is a diagram describing the operation and effects of the image sensor according to the embodiment of the present technology (second interference example).
Figure 12:
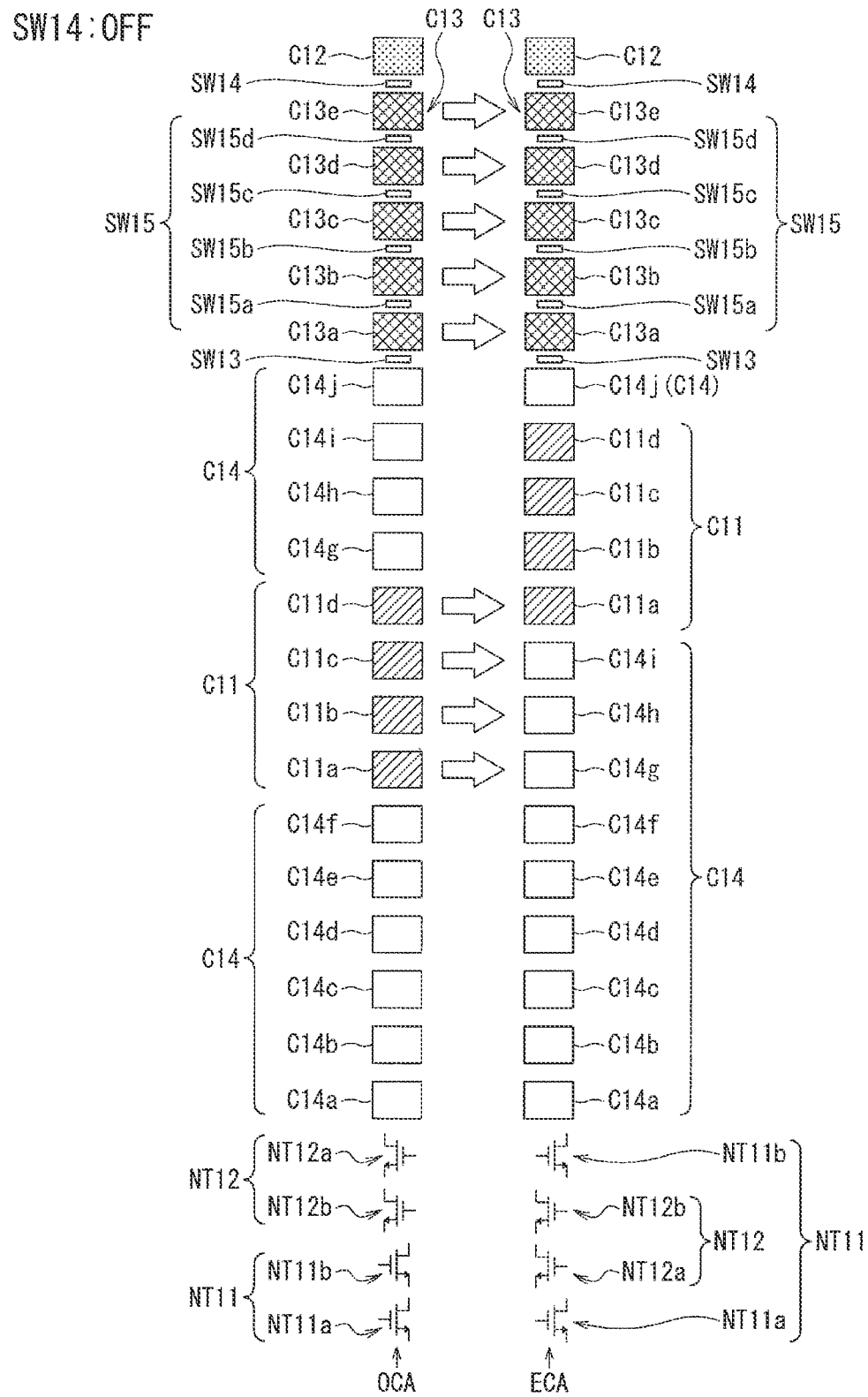
FIG. 12 is a diagram describing the operation and effects of the image sensor according to the embodiment of the present technology (third interference example).

Next, the operation and effects of the image sensor 1 according to this embodiment will be described using FIG. 10 to FIG. 12 while referring to FIG. 4. In FIG. 10 to FIG. 12, the interference from the odd-numbered column region OCA to the even-numbered column region ECA is represented by thick arrows.

First Interference Example

FIG. 10 schematically shows a state of the interference from the odd-numbered column region OCA to the even-numbered column region ECA in the case where the switch SW13 is in the off state and the switches other than the switch SW13 are in the on state. That is, FIG. 10 schematically shows the state of the interference in the case where all of the capacitors C13 that function as the switching capacitance are used as the input capacitances for the reference signal RAMP.

As shown in FIG. 10, in the case where the switch SW13 is in the off state, the input capacitance for the pixel signal VSL is only the capacitor C11 (split capacitors C11a to C11d). Therefore, the voltage variation in the split capacitors C11a to C11c in the odd-numbered column region OCA affects the split capacitors C14g to C14i in the even-numbered column region ECA. Further, the voltage variation in the split capacitor C11d in the odd-numbered column region OCA affects the split capacitor C11a in the even-numbered column region ECA. As a result, the large-amplitude aggressor in the odd-numbered column region OCA affects the NMOS transistor NT11 and the NMOS transistor NT12 of the differential amplifier 201 in the even-numbered column region ECA at the ratio of 1:3. For this reason, the imbalance of the interference for the differential pair of the differential amplifier 201 in the even-numbered column region ECA from the large-amplitude aggressor in the odd-numbered column region OCA is −2 (=1−3).

Meanwhile, the gate of the split transistor NT11a of the differential amplifier 201 in the odd-numbered column region OCA affects the split transistor NT11a of the differential amplifier 201 in the even-numbered column region ECA. Further, the gate of the split transistor NT11b of the differential amplifier 201 in the odd-numbered column region OCA affects the split transistor NT12a of the differential amplifier 201 in the even-numbered column region ECA. For this reason, the voltage variation of the gate of the MOS transistor NT11 of the differential amplifier 201 in the even-numbered column region ECA is cancelled by the differential pair of the differential amplifier 201 in the even-numbered column region ECA.

From the above-mentioned formula (1), in the case where the switch SW13 is in the off state, the input attenuation gain Ainv for the pixel signal VSL is "(C11a+C11b+C11c+C11d)/ΣC". The split capacitors C11a to C11d, the capacitor C12, the split capacitors C13a to C13e, and the split capacitors C14a to C14i have the same capacitance value in this embodiment. Therefore, the signal attenuation amount of the pixel signal VSL is 4/10. Therefore, the pixel signal VSL-referred imbalance (i.e., the final noise) is −5.0 (=−2/(4/10)).

Second Interference Example

FIG. 11 schematically shows the state of the interference from the odd-numbered column region OCA to the even-numbered column region ECA in the case where the switch SW15$b$ is in the off state and the switches other than the switch SW15$b$ are in the on state. That is, FIG. 11 schematically shows the state of the interference in the case where 2/5 of split capacitors constituting the capacitor C13 that functions as the switching capacitance are used as the input capacitances for the pixel signal VSL and 3/5 of the split capacitors are used as the input capacitances for the reference signal RAMP.

As shown in FIG. 11, in the case where the switch SW15$b$ is in the off state, the input capacitances for the pixel signal VSL are the capacitor C11 (the split capacitors C11$a$ to C11$d$) and the split capacitors C13$a$ and C13$b$ constituting the capacitor C13. For this reason, the voltage variation of the split capacitors C11$a$ to C11$c$ in the odd-numbered column region OCA affects the split capacitors C14$g$ to C14$i$ in the even-numbered column region ECA. Further, the voltage variation of the split capacitor C11$d$ in the odd-numbered column region OCA affects the split capacitor C11$a$ in the even-numbered column region ECA. In addition, the voltage variation of the split capacitors C13$a$ and C13$b$ affects the split capacitors C13$a$ and C13$b$ in the even-numbered column region ECA. As a result, the large-amplitude aggressor in the odd-numbered column region OCA affects the NMOS transistor NT11 and the NMOS transistor NT12 of the differential amplifier 201 in the even-numbered column region ECA at the ratio of 3:3. For this reason, the imbalance of the interference for the differential pair of the differential amplifier 201 in the even-numbered column region ECA from the large-amplitude aggressor in the odd-numbered column region OCA is 0 (=3-3).

Meanwhile, the gate of the split transistor NT11$a$ of the differential amplifier 201 in the odd-numbered column region OCA affects the split transistor NT11$a$ of the differential amplifier 201 in the even-numbered column region ECA. Further, the gate of the split transistor NT11$b$ of the differential amplifier 201 in the odd-numbered column region OCA affects the split transistor NT12$a$ of the differential amplifier 201 in the even-numbered column region ECA. For this reason, the voltage variation of the gate of the MOS transistor NT11 of the differential amplifier 201 in the even-numbered column region ECA is cancelled by the differential pair of the differential amplifier 201 in the even-numbered column region ECA.

From the above-mentioned formula (1), in the case where the switch SW13 is in the off state, the input attenuation gain Ainv for the pixel signal VSL is "(C11$a$+C11$b$+C11$c$+C11$d$+C13$a$+C13$b$)/ΣC". For this reason, the signal attenuation amount of the pixel signal VSL is 6/10. Therefore, the pixel signal VSL-referred imbalance (i.e., the final noise) is 0.0 (=0/(6/10)).

Third Interference Example

FIG. 12 schematically shows the state of the interference from the odd-numbered column region OCA to the even-numbered column region ECA in the case where the switch SW14 is in the off state and the switches other than the switch SW14 are in the on state. That is, FIG. 12 schematically shows the state of the interference in the case where all of the split capacitors constituting the capacitor C13 that functions as the switching capacitance are used as the input capacitances for the pixel signal VSL.

As shown in FIG. 12, in the case where the switch SW14 is in the off state, the input capacitances for the pixel signal VSL are the capacitor C11 (the split capacitors C11$a$ to C11$d$) and the split capacitors C13$a$ to C13$e$ constituting the capacitor C13. For this reason, the voltage variation of the split capacitors C11$a$ to C11$c$ in the odd-numbered column region OCA affects the split capacitors C14$g$ to C14$i$ in the even-numbered column region ECA. Further, the voltage variation of the split capacitor C11$d$ in the odd-numbered column region OCA affects the split capacitor C11$a$ in the even-numbered column region ECA. In addition, the voltage variation of the split capacitors C13$a$ to C13$e$ affects the split capacitors C13$a$ to C13$e$ in the even-numbered column region ECA. As a result, the large-amplitude aggressor in the odd-numbered column region OCA affects the NMOS transistor NT11 and the NMOS transistor NT12 of the differential amplifier 201 in the even-numbered column region ECA at the ratio of 6:3. For this reason, the imbalance of the interference for the differential pair of the differential amplifier 201 in the even-numbered column region ECA from the large-amplitude aggressor in the odd-numbered column region OCA is +3 (=6-3).

Meanwhile, the gate of the split transistor NT11$a$ of the differential amplifier 201 in the odd-numbered column region OCA affects the split transistor NT11$a$ of the differential amplifier 201 in the even-numbered column region ECA. Further, the gate of the split transistor NT11$b$ of the differential amplifier 201 in the odd-numbered column region OCA affects the split transistor NT12$a$ of the differential amplifier 201 in the even-numbered column region ECA. For this reason, the voltage variation of the gate of the MOS transistor NT11 of the differential amplifier 201 in the even-numbered column region ECA is cancelled by the differential pair of the differential amplifier 201 in the even-numbered column region ECA.

From the above-mentioned formula (1), in the case where the switch SW13 is in the off state, the input attenuation gain Ainv for the pixel signal VSL is "(C11$a$+C11$b$+C11$c$+C11$d$+C13$a$+C13$b$+C13$c$+C13$d$+C13$e$)/ΣC". For this reason, the signal attenuation amount of the pixel signal VSL is 9/10. Therefore, the pixel signal VSL-referred imbalance (i.e., the final noise) is +3.3 (=+3/(9/10)).

Incidentally, assumption is made that the capacitor C11 in the odd-numbered column region OCA is disposed facing the capacitor C11 and the capacitor C14 in the even-numbered column region ECA with the same area. Further, similarly to the third interference example, in the case where the switch SW14 is in the off state, the input capacitances for the pixel signal VSL are the capacitor C11 (the split capacitors C11$a$ to C11$d$) and the split capacitors C13$a$ to C13$e$ constituting the capacitor C13. For this reason, the voltage variation of the split capacitors C11$a$ and C11$b$ in the odd-numbered column region OCA affects the split capacitors C14$h$ and C14$i$ in the even-numbered column region ECA. Further, the voltage variation of the split capacitors C11$c$ and C11$d$ in the odd-numbered column region OCA affects the split capacitors C11$a$ and C11$b$ in the even-numbered column region ECA. In addition, the voltage variation of the split capacitors C13$a$ to C13$e$ affects the split capacitors C13$a$ to C13$e$ in the even-numbered column region ECA. As a result, the large-amplitude aggressor in the odd-numbered column region OCA affects the NMOS transistor NT11 and the NMOS transistor NT12 of the differential amplifier 201 in the even-numbered column region ECA at the ratio of 7:2. For this reason, the imbalance of the interference for the differential pair of the differential amplifier 201 in the even-numbered column region ECA from the large-amplitude aggressor in the odd-numbered column region OCA is +5 (=7−2). Therefore, the pixel signal VSL-referred imbalance (i.e., the final noise) is +5.5 (=+5/(9/10)).

When the capacitor C11 in the odd-numbered column region OCA is disposed facing the capacitor C11 and the capacitor C14 in the even-numbered column region ECA with the same area as described above, the input capacitance for the pixel signal VSL and the input capacitance for the reference signal RAMP change, and thus, the pixel signal VSL-referred imbalance increases.

In contrast, in this embodiment, the capacitor C11 in the odd-numbered column region OCA is disposed facing the capacitor C11 and the capacitor C14 in the even-numbered column region ECA with different areas. As a result, even in the case where the input capacitance for the pixel signal VSL and the input capacitance for the reference signal RAMP change, the pixel signal VSL-referred imbalance is suppressed to the range of −5.0 to +3.3.

As described above, the image sensor 1 according to this embodiment includes the capacitor C11 in the odd-numbered column region OCA, which is disposed facing the capacitor C11 and the capacitor C14 in the even-numbered column region ECA with different areas. As a result, the image sensor 1 is capable of reducing crosstalk in the ADC 105.

Modified Example of this Embodiment

Next, an image sensor according to a modified example of this embodiment will be described with reference to FIG. 13 to FIG. 15. Note that in the description of the modified example, components exhibiting the same effects and functions as those in the above-mentioned embodiment are denoted by the same reference symbols, and description thereof is omitted. Further, the entire configuration of the image sensor according to the modified example of this embodiment is similar to that of the image sensor 1 shown in FIG. 4. For this reason, the entire configuration of the image sensor according to the modified example of this embodiment will be described with reference to the reference symbols shown in FIG. 4 as necessary.

Modified Example 1

An image sensor according to a modified example 1 is characterized in that the differential pair of the differential amplifier includes a PMOS transistor.

Figure 13:
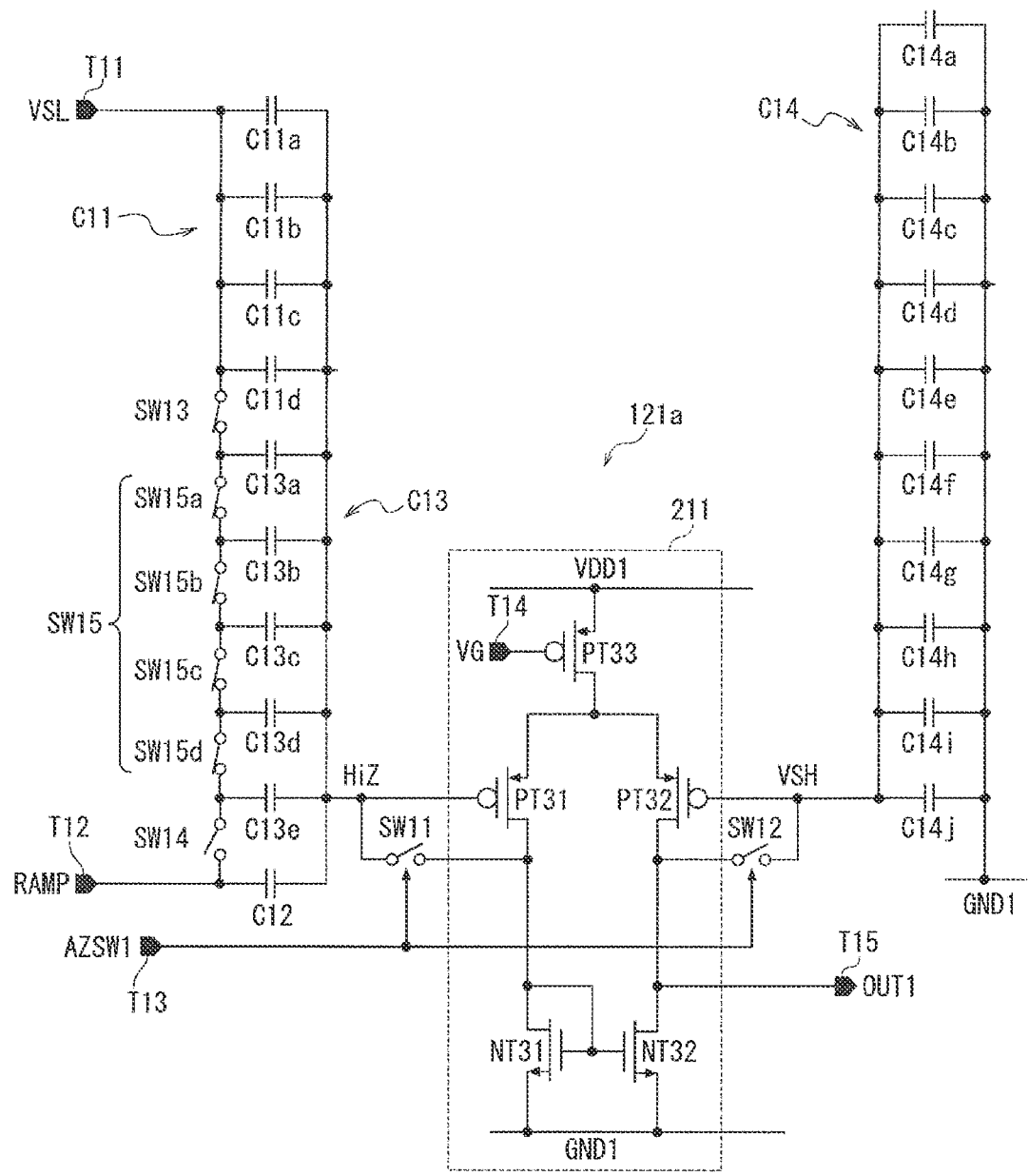
FIG. 13 is a circuit diagram showing a configuration example of a comparator provided in an image sensor according to a modified example 1 of the embodiment of the present technology.

As shown in FIG. 13, a comparator 121a is different from the comparator 121 in that a differential amplifier 211 is provided instead of the differential amplifier 201.

The differential amplifier 211 includes a PMOS transistor PT31 to a PMOS transistor PT33, an NMOS transistor NT31, and an NMOS transistor NT32.

A source of the NMOS transistor NT31 and a source of the NMOS transistor NT32 are connected to the ground GND1. A drain of the NMOS transistor NT31 is connected to a gate of the NMOS transistor NT31 and a drain of the PMOS transistor PT31. A drain of the NMOS transistor NT32 is connected to a drain of the PMOS transistor PT32 and the output terminal T15 of the output signal OUT1. A source of the PMOS transistor PT31 is connected to a source of the PMOS transistor PT32 and a drain of the PMOS transistor PT33. A source of the PMOS transistor PT33 is connected to the power source VDD1.

Then, the NMOS transistor NT31 and the NMOS transistor NT32 constitute a current mirror circuit. Further, the PMOS transistor PT31 to the PMOS transistor PT33 constitute a differential comparator. That is, the PMOS transistor PT33 operates as a current source by the bias voltage VG input from the outside via the input terminal T14, and the PMOS transistor PT31 and the PMOS transistor PT32 operate as differential transistors. Although not shown, each of the PMOS transistor PT31 and the PMOS transistor PT32 includes two split transistors connected in parallel, similarly to the NMOS transistor NT11 and the NMOS transistor NT12 of the comparators 121. Crosstalk in the differential pair of the differential amplifier 211 can be reduced by arranging the two split transistors in the even-numbered column region and the odd-numbered column region in the same manner as those shown in FIG. 7.

The capacitor C11, the capacitor C12, the capacitor C13, the switch SW13, the switch SW14, and the switch group SW15 are connected to a gate of the PMOS transistor PT31. The connection relationship between the capacitor C11, the capacitor C12, the capacitor C13, the switch SW13, the switch SW14, and the switch group SW15 is the same as the connection relationship between the capacitor C11, the capacitor C12, the capacitor C13, the switch SW13, the switch SW14, and the switch group SW15 provided in the comparator 121. For this reason, the description of the connection relationship is omitted.

The capacitor C14 is connected to a gate of the PMOS transistor PT32. The configuration of the capacitor C14 is the same as the configuration of the capacitor C14 provided in the comparator 121. For this reason, description of the configuration of the capacitor C14 will be omitted.

The comparator 121a has a configuration in which the polarity of the transistor of the comparator 121 is reversed, and performs an operation similar to that of the comparator 121. Further, by using the comparator 121a, the voltage of the power source VDD1 can be lowered and the power consumption can be reduced, similarly to the case where the comparator 121 is used.

Further, the image sensor according to this modified example includes the capacitor C11 in the odd-numbered column region OCA, which is disposed facing the capacitor C11 and the capacitor C14 in the even-numbered column region ECA with different areas. As a result, the image sensor according to this modified example is capable of reducing crosstalk in the ADC 105.

Modified Example 2

An image sensor according to a modified example 2 is characterized in that the differential amplifier includes two differential pairs.

Figure 14:
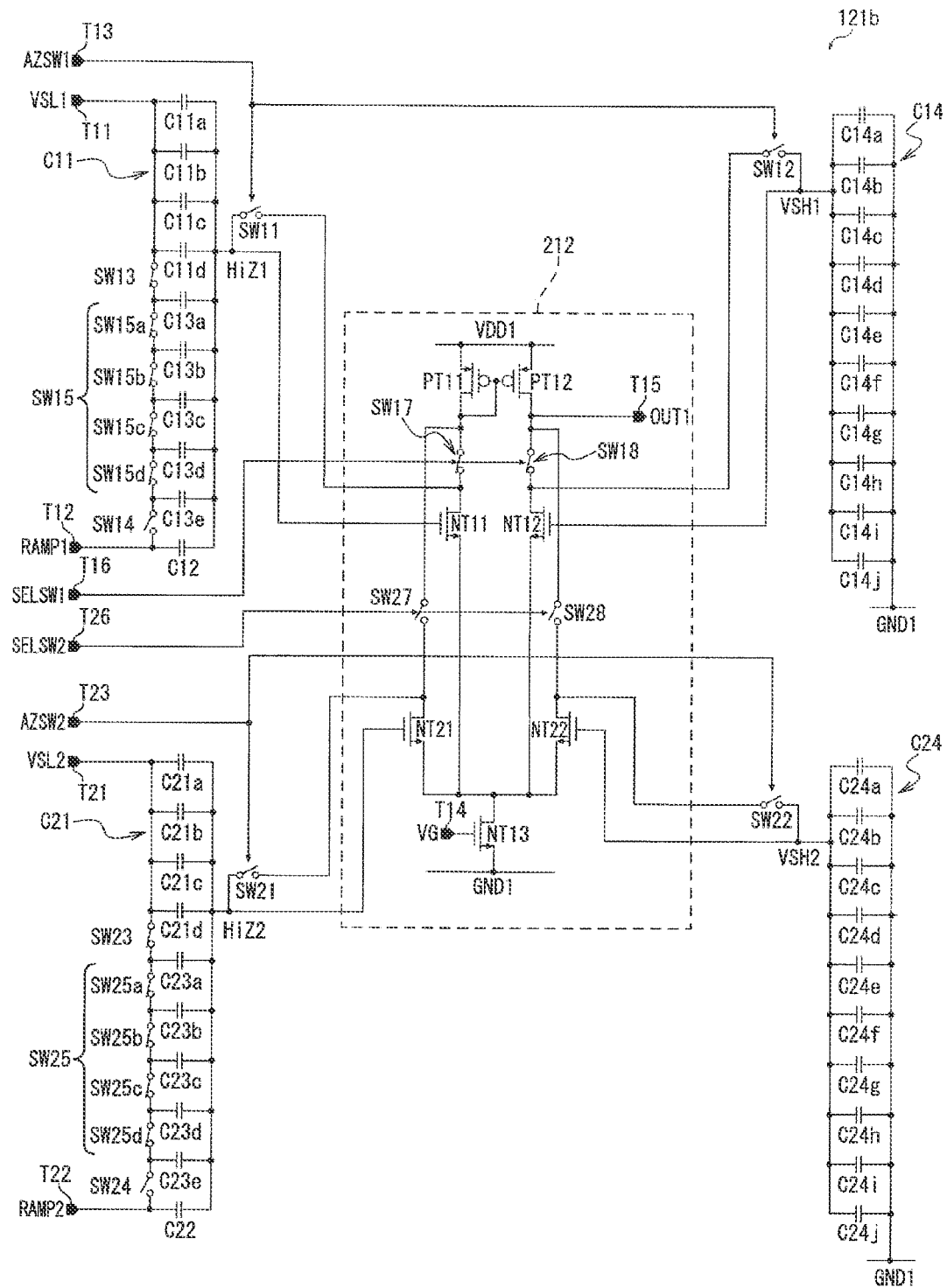
FIG. 14 is a circuit diagram showing a configuration example of a comparator provided in an image sensor according to a modified example 2 of the embodiment of the present technology.

As shown in FIG. 14, a comparator 121b includes a differential amplifier 212. The differential amplifier 212 includes the P-type (PMOS) transistor PT11, the PMOS transistor PT12, the N-type MOS (NMOS) transistors NT11, NT12, and NT13, and NMOS transistors NT21 and NT22. As will be described below in detail, the NMOS transistor NT11 and the NMOS transistor NT12 as well as the NMOS transistor NT21 and the NMOS transistor NT22 each include two split transistors connected in parallel.

The source of the PMOS transistor PT11 and the source of the PMOS transistor PT12 are connected to the power source VDD1. The drain of the PMOS transistor PT11 is connected to the respective gates of the PMOS transistors PT11 and PT12 and one terminal of each of switches SW17 and SW27. A different terminal of the switch SW17 is connected to the drain of the NMOS transistor NT11 and one terminal of the switch SW11. The drain of the PMOS transistor PT12 is connected to the output terminal T15 of the output signal OUT1 and one terminal of each of switches SW18 and SW28. A different terminal of the switch SW18 is connected to the drain of the NMOS transistor NT12 and one terminal of the switch SW12. The source of the NMOS transistor NT11 is connected to the sources of the NMOS transistors NT12, NT21, and NT22 and the drain of the NMOS transistor NT13. The source of the NMOS transistor NT13 is connected to the ground GND1.

Then, the PMOS transistor PT11 and the PMOS transistor PT12 constitute a current mirror circuit. Further, the NMOS transistor NT11, the NMOS transistor NT12, and the NMOS transistor NT13 constitute a differential comparator. That is, the NMOS transistor NT13 operates as a current source by the bias voltage VG input from the outside via the input terminal T14, and the NMOS transistor NT11 and the NMOS transistor NT12 operate as differential transistors. In addition, the NMOS transistor NT21, the NMOS transistor NT22, and the NMOS transistor NT13 constitute a differential comparator. That is, the NMOS transistor NT23 operates as a current source by the bias voltage VG input from the outside via the input terminal 114, and the NMOS transistor NT21 and the NMOS transistor NT22 operate as differential transistors.

The switch SW17 and the switch SW18, and the switch SW27 and the switch SW28 are controlled so that the on state and the off state thereof are opposite to each other. That is, in the case where the switch SW17 and the switch SW18 are in the on state, the switch SW27 and the switch SW28 are in the off state. Meanwhile, in the case where the switch SW17 and the switch SW18 are in the off state, the switch SW27 and the switch SW28 are in the on state. As a result, a differential pair of the NMOS transistors NT11 and NT12 or a differential pair of the NMOS transistors NT21 and NT22 is connected between the current mirror circuit including the PMOS transistors PT11 and PT12 and the NMOS transistor NT13 serving as a current source.

The capacitor C11, the capacitor C12, the capacitor C13, the switch SW13, the switch SW14, and the switch group SW15 are connected to the gate of the NMOS transistor NT11. The connection relationship between the capacitor C11, the capacitor C12, the capacitor C13, the switch SW13, the switch SW14, and the switch group SW15 is the same as the connection relationship between the capacitor C11, the capacitor C12, the capacitor C13, the switch SW13, the switch SW14, and the switch group SW15 provided in the comparator 121. For this reason, the description of the connection relationship is omitted. The capacitor C11 is the input capacitance for a pixel signal VSL1. The capacitor C12 is the input capacitance for a reference signal RAMP1. The reference signal RAMP1 is generated by the DAC 104 (see. FIG. 2).

The capacitor C14 is connected to the gate of the NMOS transistor NT12. The configuration of the capacitor C14 is the same as the configuration of the capacitor C14 provided in the comparator 121. For this reason, description of the configuration of the capacitor C14 is omitted.

The comparator 121b according to this modified example includes a capacitor C21, a capacitor C22, a capacitor C23, and a capacitor C24.

The capacitor C21 of the comparator 121b formed in the even-numbered column region ECA corresponds to an example of a first capacitance that is connected to a first signal line connected to a first pixel including a photoelectric conversion element and disposed in a first region. In this case, the unit pixels Phi (i is a natural number and an even number equal to or less than n) shown in FIG. 2 correspond to an example of a first pixel. Further, the vertical signal lines 109-$i$ (i is a natural number and an even number equal to or less than n) shown in FIG. 2 correspond to an example of a first signal line. Further, the even-numbered column region ECA shown in FIG. 2 corresponds to a first region. Further, the photodiode 151 shown in FIG. 3 corresponds to an example of a photoelectric conversion element.

The capacitor C22 of the comparator 121b formed in the even-numbered column region ECA corresponds to a second capacitance that is disposed in the even-numbered column region ECA and connected to the DAC (example of a reference signal generation unit) 104 (see. FIG. 2) that generates a reference signal RAMP2. The capacitor C23 of the comparator 121b formed in the even-numbered column region ECA corresponds to an example of a third capacitance that is disposed in the even-numbered column region ECA and provided to be connectable to the capacitor C21 and the capacitor C22. The capacitor C24 of the comparator 121b formed in the even-numbered column region ECA corresponds to an example of a fourth capacitance that is disposed in the even-numbered column region ECA and connected to the ground (example of a supply unit of a reference potential) GND1.

The capacitor C21 of the comparator 121b formed in the odd-numbered column region OCA corresponds to an example of a fifth capacitance that is connected to a second signal line connected to a second pixel including a photoelectric conversion element and disposed in a second region. In this case, the unit pixels P1$i$ (i is a natural number and an odd number equal to or less than n) shown in FIG. 2 correspond to an example of a second pixel. Further, the vertical signal lines 109-$i$ (i is a natural number and an odd number equal to or less than n) shown in FIG. 2 correspond to an example of a second signal line. Further, the even-numbered column region EOA shown in FIG. 2 corresponds to a second region. Further, the odd-numbered column region OCA shown in FIG. 2 corresponds to a second region. Further, the photodiode 151 shown in FIG. 3 corresponds to an example of a photoelectric conversion element.

The capacitor C22 of the comparator 121b formed in the odd-numbered column region OCA corresponds to a sixth capacitance that is disposed in the odd-numbered column region OCA and connected to the DAC (example of a reference signal generation unit) 104 (see FIG. 2) that generates the reference signal RAMP2. The capacitor C23 of the comparator 121b formed in the odd-numbered column region OCA corresponds to an example of a seventh capacitance that is disposed in the odd-numbered column region OCA and provided to be connectable to the capacitor C21 and the capacitor C22. The capacitor C24 of the comparator 121b formed in the odd-numbered column region corresponds to an example of an eighth capacitance that is disposed in the odd-numbered column region OCA and connected to the ground GND1.

The capacitor C21 is connected between an input terminal T21 of a pixel signal VSL2 and a gate of the NMOS transistor NT21. The capacitor C21 is the input capacitance for the pixel signal VSL2.

The capacitor C22 is connected between an input terminal T22 of the reference signal RAMP2 and the gate of the NMOS transistor NT21, and is the input capacitance for the reference signal RAMP2.

The capacitor C23 functions as a variable capacitor that changes the capacitance values of the capacitor C21 and the capacitor C22 in accordance with the on/off states of a switch SW23 and a switch SW24. The capacitor C23 is connected between the input terminal T21 and the gate of the NMOS transistor NT21 via the capacitor C21 and the switch SW23. Further, the capacitor C23 is connected between the input terminal T22 and the gate of the NMOS transistor NT21 via the capacitor C22 and the switch SW24.

More specifically, the capacitor C21 includes split capacitors C21a, C21b, C21c, and C21d that are a plurality of (four in this embodiment) split capacitances. Each of the split capacitors C21a, C21b, C21c, and C21d includes one electrode connected to the vertical signal lines 110 (see FIG. 2) via the input terminal T21, and a different electrode connected to the gate of the NMOS transistor NT21 of the differential amplifier 201. The capacitor C22 includes one electrode connected to the DAC 104 (see FIG. 2) via the input terminal T22, and a different electrode connected to the gate of the NMOS transistor NT21 of the differential amplifier 212.

The capacitor C23 includes split capacitors C23a, C23b, C23c, C23d, and C23e that are a plurality of (five in this embodiment) split capacitances. The comparator 121b includes a switch group SW25 for switching between connection and disconnection of two adjacent split capacitors of the split capacitors C23a, C23b, C23c, C23d, and C23e. More specifically, the switch group SW25 includes a switch SW25a for switching between connection and disconnection of two adjacent split capacitors C23a and C23b. The switch group SW25 includes a switch SW25b for switching between connection and disconnection of two adjacent split capacitors C23b and C23c. The switch group SW25 includes a switch SW25c for switching between connection and disconnection of two adjacent split capacitors C23c and C23d. The switch group SW25 includes a switch SW25d for switching between connection and disconnection of two adjacent split capacitors C23d and C23e.

Each of the split capacitors C23a to C23e includes one electrode connected to the switches SW25a to SW25d, and a different electrode connected to the gate of the NMOS transistor NT21 of the differential amplifier 212. More specifically, the split capacitor C23a includes one electrode connected to one terminal of the switch SW25a, and a different electrode connected to the gate of the NMOS transistor NT21. One electrode of the split capacitor C23a is also connected to a different terminal of the switch SW23. One terminal of the switch SW23 is connected to one electrode of the split capacitor C21d of the capacitor C21.

The split capacitor C23b includes one electrode connected to a different terminal of the switch SW25a and one terminal of the switch SW25b, and a different electrode connected to the gate of the NMOS transistor NT21. The split capacitor C23c includes one electrode connected to a different terminal of the switch SW25b and one terminal of the switch SW25c, and a different electrode connected to the gate of the NMOS transistor NT21. The split capacitor C23d includes one electrode connected to a different terminal of the switch SW25c and one terminal of the switch SW25d, and a different electrode connected to the gate of the NMOS transistor NT21.

The split capacitor C23e includes one electrode connected to a different terminal of the switch SW25d, and a different electrode connected to the gate of the NMOS transistor NT21. One electrode of the split capacitor C23e is also connected to one terminal of the switch SW24. A different terminal of the switch SW24 is connected to one electrode of the capacitor C22.

Therefore, the switch SW23, the switches SW25a to SW25d, and the switch SW24 are subordinately connected between the one electrode of the split capacitor C21d and the one electrode of the capacitor C22.

By controlling the on/off states of the switch SW23, the switch SW24, and the switches SW25a to SW25d, the ratio of the input capacitance for the pixel signal VSL2 and the input capacitance for the reference signal RAMP2 is controlled. The switch SW23, the switch SW24, and the switches SW25a to SW25d are controlled so that at least one of them is turned off.

Hereinafter, reference symbols of the split capacitors C21a to C21d, the capacitor C22, and the split capacitors C23a to C23e are also used as reference symbols indicating respective capacitance values. The split capacitors C21a to C21d, the capacitor C22, and the split capacitors C23a to C23e are connected in parallel. For this reason, an input-capacitance attenuation gain Ainv2 for the pixel signal VSL2 can be represented by the following formula (3), and an input-attenuation gain Ainr2 for the reference signal RAMP can be represented by the following formula (4).

$$A\text{inv}2 = (C21a + C21b + C21c + C21d + C2\alpha)/\Sigma C2 \quad (3)$$

$$A\text{inr}2 = (C22 + C2\beta)/\Sigma C2 \quad (4)$$

In the formula (3) and the formula (4), "$\Sigma C2$" represents the total sum of capacitance values of the split capacitors C21a to C21d, the capacitor C22, and the split capacitors C23a to C23e. Further, "$C2\alpha$" in the formula (3) represents the capacitance value of the capacitor added to the pixel signal VSL2 side in accordance with the on/off states of the switch SW23, the switch SW24, and the switches SW25a to SW25d. Further, "$C2\beta$" in the formula (4) represents the capacitance value of the capacitor added to the reference signal RAMP2 in accordance with the on/off states of the switch SW23, the switch SW24, and the switches SW25a to SW25d. "$C2\alpha$" in the formula (3) and "$C2\beta$" in the formula (4) are as follows in accordance with the on/off states of the switch SW23, the switch SW24, and the switches SW25a to SW25d.

(A) In the case where the switch SW23 is in the off state and the switches other than the switch SW23 are in the on state:

$$C2\alpha = 0$$

$$C2\beta = C23a + C23b + C23c + C23d + C23e$$

(B) In the case where the switch SW25a is in the off state and the switches other than the switch SW25a are in the on state:

$$C2\alpha = C23a$$

$$C2\beta = C23b + C23c + C23d + C23e$$

(C) In the case where the switch SW25b is in the off state and the switches other than the switch SW25b are in the on state:

$$C2\alpha = C23a + C23b$$

$$C2\beta = C23c + C23d + C23e$$

(D) In the case where the switch SW25c is in the off state and the switches other than the switch SW25c are in the on state:

$$C2\alpha = C23a + C23b + C23c$$

$$C2\beta = C23d + C23e$$

(E) In the case where the switch SW25d is in the off state and the switches other than the switch SW25d are in the on state:

$C2\alpha = C23a + C23b + C23c + C23d$ $C2\beta = C23e$ (F) In the case where the switch SW25e is in the off state and the switches other than the switch SW25e are in the on state:

$C2\alpha = C23a + C23b + C23c + C23d + C23e$ $C2\beta = 0$

By switching the on/off states of the switch SW23, the switch SW24, and the switches SW25a to SW25d as described above, the input capacitance for the pixel signal VSL2 and the input capacitance for the reference signal RAMP2 can be changed in a stepwise manner.

An amplitude ΔVSL 2 of the voltage of the pixel signal VSL2 is ΔVSL2×Ainv2 in the gate of the NMOS transistor NT21. Therefore, as the value of "C2α" in the formula (3) becomes smaller, the amplitude of the pixel signal VSL2 input to the differential amplifier 212 is attenuated. As a result, the input-referred noise is increased. In contrast, by increasing the ratio of the input capacitance of the pixel signal VSL2 to the input capacitance of the reference signal RAMP2, i.e., by increasing "C2α" in the formula (3) and decreasing "C2β" in the formula (4), it is possible to suppress the attenuation of the pixel signal VSL2 input to the differential amplifier 212 and suppress the input-referred noise.

However, when the ratio of the input capacitance of the pixel signal VSL2 to the input capacitance of the reference signal RAMP2 is increased, the attenuation amount of the reference signal RAMP2 input to the differential amplifier 212 increases conversely.

As described for the reference signal RAMP and the pixel signal VSL using FIG. 5, when the ratio of the input capacitance of the pixel signal VSL2 to the input capacitance of the reference signal RAMP2 is increased, the amplitude of the reference signal RAMP2 input to the differential amplifier 212 is reduced. As a result, the dynamic range of the ADC 105 is lowered.

In contrast, for example, it is conceivable to increase the amplitude of the reference signal RAMP2 input to the differential amplifier 212 and suppress a decrease in the dynamic range of the ADC 105 by increasing the amplitude of the reference signal RAMP2 output from the DAC 104.

However, the maximum value of the amplitude of the reference signal RAMP2 is limited by the specifications of the DAC 104 and the like. For example, in the high gain mode, since the amplitude of the reference signal RAMP2 is set to be small, the amplitude of the reference signal RAMP2 can be increased. Meanwhile, in the low gain mode, since the amplitude of the reference signal RAMP2 is set to be large in advance, it is difficult to further increase the amplitude of the reference signal RAMP2 in some cases.

Therefore, for example, in the high gain mode, the ratio of the input capacitance of the pixel signal VSL2 to the input capacitance of the reference signal RAMP2 is increased in a possible range, and the amplitude of the reference signal RAMP2 is increased. As a result, in the high gain mode susceptible to noise, it is possible to suppress the attenuation of the pixel signal VSL2 input to the differential amplifier 212, and suppress the influence of noise.

Meanwhile, for example, in the low gain mode, the input capacitance for the reference signal RAMP2 and the input capacitance for the pixel signal VSL2 only need to be set to values close to each other.

As shown in FIG. 14, the capacitor C24 includes split capacitors C24a, C24b, C24c, C24d, C24e, C24f, C24g, C24h, C24i, and C24j that are a plurality of (10 in this embodiment) split capacitances. Each of the split capacitors C24a, C24b, C24c, C24d, C24e, C24f, C24g, C24h, C24i, and C24j includes one electrode connected to the ground GND1, and a different electrode connected to a gate of the NMOS transistor NT22 of the differential amplifier 212. The split capacitors C24a, C24b, C24c, C24d, C24e, C24f, C24g, C24h, C24i, and C24j are connected in parallel between the ground GND1 and the gate of the NMOS transistor NT22.

In the case of the comparator 121b formed in the even-numbered column region ECA, the split capacitors C21a to C21d correspond to an example of a first split capacitance. In the case of the comparator 121b formed in the even-numbered column region ECA, the split capacitors C23a to C23d correspond to an example of a third split capacitance. In the case of the comparator 121b formed in the even-numbered column region ECA, the switch SW23 corresponds to an example of a first switching element, and the switch SW24 corresponds to an example of a second switching element. In the case of the comparator 121b formed in the even-numbered column region ECA, the switches SW25a to SW25d correspond to a third switching element.

In the case of the comparator 121b formed in the odd-numbered column region OCA, the split capacitors C21a to C21d correspond to an example of a fifth split capacitance. In the case of the comparator 121b formed in the odd-numbered column region OCA, the split capacitors C23a to C23d correspond to an example of a seventh split capacitance. In the case of the comparator 121b formed in the odd-numbered column region OCA, the switch SW23 corresponds to an example of a fifth switching element, and the switch SW24 corresponds to an example of a sixth switching element. In the case of the comparator 121b formed in the odd-numbered column region OCA, the switches SW25a to SW25d correspond to a seventh switching element.

The differential amplifier 212 includes the NMOS transistor NT21 to which the capacitor C21, the capacitor C22, and the capacitor C23 are connected, and the NMOS transistor NT22 to which the capacitor C24 is connected. Therefore, the differential amplifier 212 of the comparator 121b formed in the even-numbered column region ECA corresponds to an example of a first differential amplifier. In the case of the comparator 121b formed in the even-numbered column region ECA, the NMOS transistor NT21 corresponds to an example of one input unit provided in a first differential amplifier, and the NMOS transistor NT22 corresponds to an example of a different input unit provided in the first differential amplifier. Meanwhile, the differential amplifier 212 of the comparator 121b formed in the odd-numbered column region OCA corresponds to an example of a second differential amplifier. In the case of the comparator 121b formed in the odd-numbered column region OCA, the NMOS transistor NT21 corresponds to an example of one input unit provided in a second differential amplifier, and the NMOS transistor NT22 corresponds to an example of a different input unit provided in the second differential amplifier.

The switch SW11 is connected between the drain-gate of the NMOS transistor NT11. The switch SW11 is switched from the on state to the off state or from the off state to the on state by the drive signal AZSW1 input from the timing control circuit 102 via the input terminal T13.

The switch SW12 is connected between the drain-gate of the NMOS transistor NT12. The switch SW12 is switched from the on state to the off state or from the off state to the on state by the drive signal AZSW1 input from the timing control circuit 102 via the input terminal T13.

The switch SW17 and the switch SW18 are switched from the on state to the off state or from the off state to the on state by a drive signal SELSW1 input from the timing control circuit 102 via an input terminal T16.

Note that hereinafter, a connection point between the capacitor C11, the capacitor C12, the capacitor C13, and the switch SW11 will be referred to as a node HiZ1. Further, hereinafter, the connection point between the gate of the NMOS transistor NT12, the capacitor C14, and the switch SW12 will be referred to as a node VSH1.

A switch SW21 is connected between the drain-gate of the NMOS transistor NT21. The switch SW21 is switched from the on state to the off state or from the off state to the on state by a drive signal AZSW2 input from the timing control circuit 102 via an input terminal T23.

A switch SW22 is connected between the drain-gate of the NMOS transistor NT22. The switch SW22 is switched from the on state to the off state or from the off state to the on state by the drive signal AZSW2 input from the timing control circuit 102 via the input terminal T23.

The switch SW27 and the switch SW28 are switched from the on state to the off state or from the off state to the on state by a drive signal SELSW2 input from the timing control circuit 102 via an input terminal T26. The drive signal SELSW2 is a signal whose signal level is inverted with respect to the drive signal SELSW1.

Note that hereinafter, a connection point between the capacitor C21, the capacitor C22, the capacitor C23, and the switch SW21 will be referred to as a node HiZ2. Further, hereinafter, a connection point between the gate of the NMOS transistor NT22, the capacitor C24, and the switch SW22 will be referred to as a node VSH2.

Although not shown, the NMOS transistor NT21 has a configuration similar to that of the NMOS transistor NT11 shown in FIG. 6, and includes two split transistors connected in parallel. Similarly, the NMOS transistor NT22 has a configuration similar to that of the NMOS transistor NT12 shown in FIG. 6, and includes two split transistors connected in parallel.

Next, an example of the arrangement relationship of capacitors and NMOS transistors of the comparator 121b formed in the odd-numbered column region OCA and the even-numbered column region ECA will be described using FIG. 15. In FIG. 15, the even-numbered column region ECA and the odd-numbered column region OCA are illustrated as being divided for the convenience of the paper, but in reality, they are straight continuous regions without being divided.

In the even-numbered column region ECA, the NMOS transistor NT11 and the NMOS transistor NT12 are a differential pair for comparing the unit pixels P1 (2*i*) (i is an odd number less than or equal to n) and the reference signal RAMP1. Further, in the even-numbered column region ECA, the NMOS transistor NT21 and the NMOS transistor N22 are a differential pair for comparing the unit pixels P1 (2*i*) (i is an even number less than or equal to n) and the reference signal RAMP2. Further, in the odd-numbered column region OCA, the NMOS transistor NT11 and the NMOS transistor NT12 are a differential pair for comparing unit pixels P1 (2*i*-1) (i is an odd number less than or equal to n) and the reference signal RAMP1. Further, in the odd-numbered column region OCA, the NMOS transistor NT21 and the NMOS transistor NT22 are a differential pair for comparing the unit pixels P1 (2*i*-1) (i is an even number less than or equal to n) and the reference signal RAMP2.

In the even-numbered column region ECA and the odd-numbered column region OCA, the arrangement of the NMOS transistor NT11, the NMOS transistor NT12, the capacitor C11, the capacitor C12, the capacitor C13, the capacitor C14, the switches SW13 and SW14, and the switch group SW15 is the same as the arrangement (see FIG. 7) in the image sensor 1 according to the above-mentioned embodiment, and therefore the description thereof is omitted.

Figure 15:
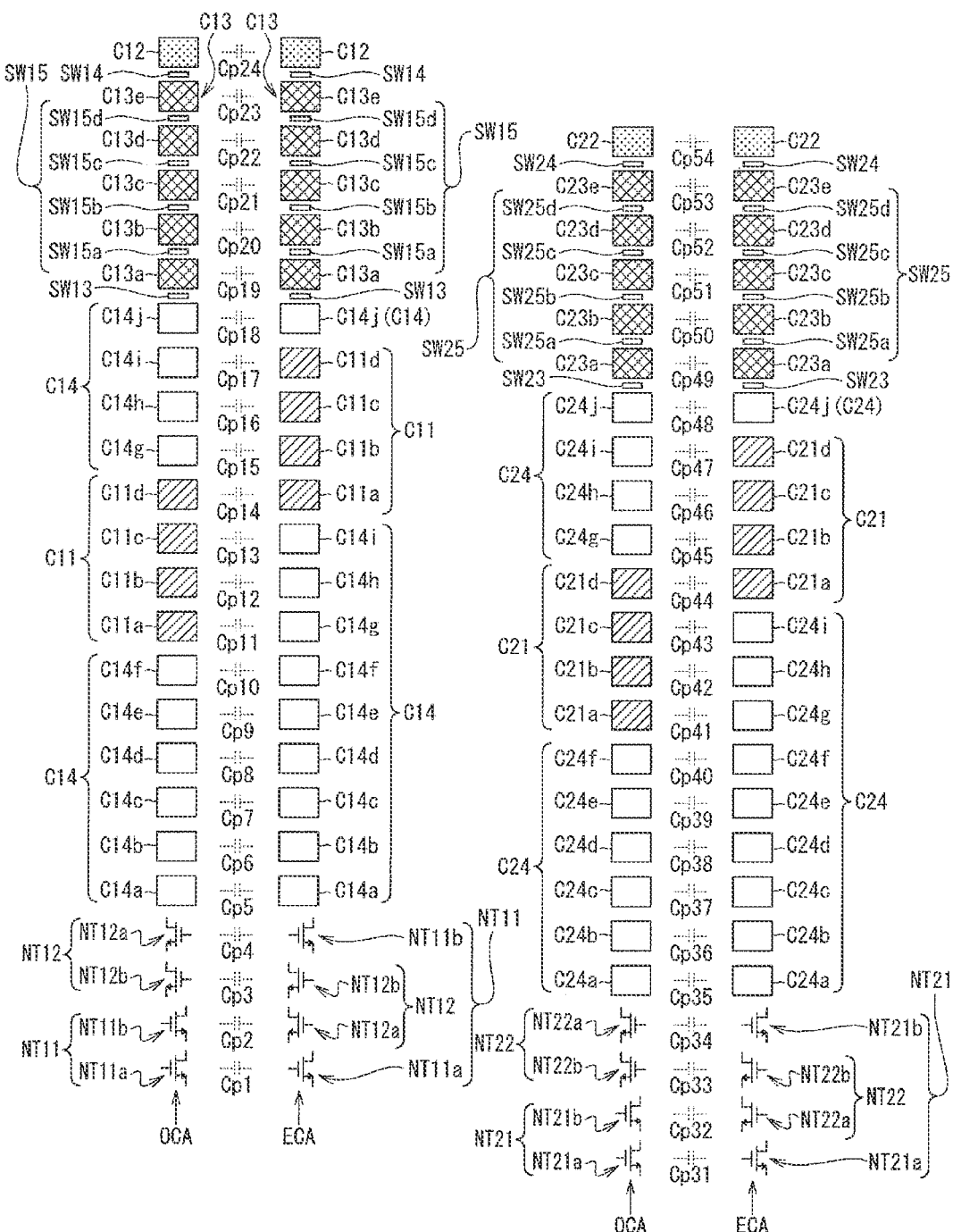
FIG. 15 is a diagram describing the image sensor according to the modified example 2 of the embodiment of the present technology and is a diagram showing an example of an arrangement relationship of the capacitors and the NMOS transistors constituting the differential pairs of the comparators formed in the odd-numbered column region and the even-numbered column region.

As shown in FIG. 15, in the even-numbered column region ECA, the capacitor C22 is disposed adjacent to the split transistor NT11*a* on the side where the split transistor NT12*a* is not disposed.

In the even-numbered column region ECA, the capacitor C23 is disposed adjacent to the capacitor C22 on the side where the split transistor NT11*a* is not disposed with the switch SW24 interposed therebetween. The split capacitors C23*a* to C23*e* that are split capacitances of the capacitor C23 are aggregated within a predetermined range of the even-numbered column region ECA. More specifically, the capacitor C22 and the split capacitor C23*e* are arranged facing each other with the switch SW24 interposed therebetween. The split capacitor C23*e*, the split capacitor C23*d*, the split capacitor C23*c*, the split capacitor C23*b*, and the split capacitor C23*a* are arranged side by side in the stated order from the side where the capacitor C22 is disposed. The switch SW25*d* is disposed between the split capacitor C23*e* and the split capacitor C23*d*. The switch SW25*c* is disposed between the split capacitor C23*d* and the split capacitor C23*c*. The switch SW25*b* is disposed between the split capacitor C23*c* and the split capacitor C23*b*. The switch SW25*a* is disposed between the split capacitor C23*b* and the split capacitor C23*a*.

In the even-numbered column region ECA, a split capacitor C24*j* that is a split capacitance of the capacitor C24 is disposed adjacent to the split capacitor C23*a* on the side where the split capacitor C23*b* is not disposed with the switch SW23 interposed therebetween. By arranging the split capacitors C23*a* to C23*e*, the switches SW25*a* to SW25*d*, the switch SW24, and the switch SW23 to be aggregated within a predetermined range as described above, the complexity of the wiring and the parasitic capacitance generated between the respective elements can be suppressed.

In the even-numbered column region ECA, the capacitor C21 is disposed adjacent to the split capacitor C24*j* on the side where the split capacitor C23*a* is not disposed. More specifically, the split capacitor C21*d*, the split capacitor C21*c*, the split capacitor C21*b*, and the split capacitor C21*a* that are split capacitances of the capacitor C21 are arranged side by side in the stated order from the side where the split capacitor C24*j* is disposed.

In the even-numbered column region ECA, the remainders of the capacitor C24, which are split capacitances of the capacitor C24, are arranged adjacent to the split capacitor C21*a* on the side where the split capacitor C21*b* is not disposed. More specifically, the remaining split capacitor C24*i*, the split capacitor C24*h*, the split capacitor C24*g*, the split capacitor C24*f*, the split capacitor C24*e*, the split capacitor C24*d*, the split capacitor C24*c*, the split capacitor C24*b*, and the split capacitor C24*a* of the capacitor C24 are arranged side by side in the stated order from the side where the split capacitor C21*a* is disposed.

In the even-numbered column region ECA, the NMOS transistor NT21 and the NMOS transistor NT22 are arranged adjacent to the split capacitor C24*a* on the side where the split capacitor C24*b* is not disposed. More specifically, a split transistor NT21*b*, a split transistor NT22*b*, a split transistor NT22*a*, and a split transistor NT21*a* are arranged side by side in the stated order from the side where the split capacitor C24*a* is disposed. The split transistor NT21*a* and the split transistor NT21*b* are transistors constituting the NMOS transistor NT21. The split transistor NT22*a* and the split transistor NT22*b* are transistors constituting the NMOS transistor NT22.

As described above, in the even-numbered column region ECA, the capacitors C21 to C24, the switch SW23, the switch group SW25, the NMOS transistor NT21, and the NMOS transistor NT22 are arranged, for example, on a straight line.

As shown in FIG. 15, in the odd-numbered column region OCA, the capacitor C22 is disposed adjacent to the split transistor NT11*a* on the side where the split transistor NT11*b* is not disposed.

In the odd-numbered column region OCA, the capacitor C23 is disposed adjacent to the capacitor C22 on the side where the split transistor NT11*a* is not disposed with the switch SW24 interposed therebetween. The split capacitors C23*a* to C23*e* that are split capacitances of the capacitor C23 are aggregated within a predetermined range of the odd-numbered column region OCA. More specifically, the capacitor C22 and the split capacitor C23*e* are arranged facing each other with the switch SW24 interposed therebetween. The split capacitor C23*e*, the split capacitor C23*d*, the split capacitor C23*c*, the split capacitor C23*b*, and the split capacitor C23*a* are arranged side by side in the stated order from the side where the capacitor C22 is disposed. The switch SW25*d* is disposed between the split capacitor C23*e* and the split capacitor C23*d*. The switch SW25*c* is disposed between the split capacitor C23*d* and the split capacitor C23*c*. The switch SW25*b* is disposed between the split capacitor C23*c* and the split capacitor C23*b*. The switch SW25*a* is disposed between the split capacitor C23*b* and the split capacitor C23*a*.

In the odd-numbered column region OCA, a part of split capacitances of the capacitor C24 is disposed adjacent to the split capacitor C23*a* on the side where the split capacitor C23*b* is not disposed with the switch SW23 interposed therebetween. By arranging the split capacitors C23*a* to C23*e*, the switches SW25*a* to SW25*d*, the switch SW24, and the switch SW23 to be aggregated within a predetermined range as described above, the complexity of the wiring and the parasitic capacitance generated between the respective elements can be suppressed.

More specifically, in the odd-numbered column region OCA, the split capacitor C24*j*, the split capacitor C24*i*, the split capacitor C24*h*, and the split capacitor C24*g* that are split capacitances of the capacitor C24 are arranged side by side in the stated order from the side where the split capacitor C23*a* is disposed.

In the odd-numbered column region OCA, the capacitor C21 is disposed adjacent to the split capacitor C24*g* on the side where the split capacitor C24*h* is not disposed. More specifically, the split capacitor C21*d*, the split capacitor C21*c*, the split capacitor C21*b*, and the split capacitor C21*a* that are split capacitances of the capacitor C21 are arranged side by side in the stated order from the side where the split capacitor C24*g* is disposed.

In the odd-numbered column region OCA, the remaining split capacitances of the capacitor C24 are arranged adjacent to the split capacitor C21*a* on the side where the split capacitor C21*b* is not disposed. More specifically, the remaining split capacitor C24*f*, the split capacitor C24*e*, the split capacitor C24*d*, the split capacitor C24*c*, the split capacitor C24*b*, and the split capacitor C24*a* of the capacitor C24 are arranged side by side in the stated order from the side where the split capacitor C21*a* is disposed.

In the odd-numbered column region OCA, the NMOS transistor NT21 and the NMOS transistor NT22 are arranged adjacent to the split capacitor C24*a* on the side where the split capacitor C24*b* is not disposed. More specifically, the split transistor NT22*a*, the split transistor NT22*b*, the split transistor NT21*b*, and the split transistor NT21*a* are arranged side by side in the stated order from the side where the split capacitor C24*a* is disposed. The split transistor NT21*a* and the split transistor NT21*b* are transistors constituting the NMOS transistor NT21. The split transistor NT22*a* and the split transistor NT22*b* are transistors constituting the NMOS transistor NT22.

As described above, in the odd-numbered column region OCA, the capacitors C21 to C24, the switch SW23, the switch group SW25, the NMOS transistor NT21, and the NMOS transistor NT22 are arranged, for example, on a straight line.

As shown in FIG. 15, in the even-numbered column region ECA, the number of the split capacitors C21*a* to C21*d* is 4, the number of the capacitors C22 is 1, the number of the split capacitors C23*a* to C23*e* is 5, and the number of the split capacitors C24*a* to C24*j* is 10. Therefore, in the even-numbered column region ECA, the total number (10) of the split capacitors C21*a* to C21*d* (example of a first split capacitance), the capacitors C22 (example of a second capacitance), and the split capacitors C23*a* to C23*e* (example of a third split capacitance) is the same as the total number of the split capacitors C24*a* to C24*j* (example of a fourth split capacitance).

Further, in the odd-numbered column region OCA, the number of the split capacitors C21*a* to C21*d* is 4, the number of the capacitors C22 is 1, the number of the split capacitors C23*a* to C23*e* is 5, and the number of the split capacitors C24*a* to C24*j* is 10. Therefore, in the odd-numbered column region OCA, the total number (10) of the split capacitors C21*a* to C21*d* (example of a fifth split capacitance), the capacitors C22 (example of a sixth capacitance), and the split capacitors C23*a* to C23*e* (example of a sixth split capacitance) is the same as the total number of the split capacitors C24*a* to C24*j* (example of an eighth capacitance).

The total number (20) of the split capacitors C21*a* to C21*d*, the capacitor C22, the split capacitors C23*a* to C23*e*, and the split capacitors C24*a* to C24*j* in the even-numbered column region ECA is the same as the total number (20) of the split capacitors C21*a* to C21*d*, the capacitors C22, the split capacitors C23*a* to C23*e*, and the split capacitors C24*a* to C24*j* in the odd-numbered column region OCA.

Each of the split capacitors C21*a* to C21*d*, the capacitor C22, each of the split capacitors C23*a* to C23*e*, and each of the split capacitors C24*a* to C24*j* in the even-numbered column region ECA and each of the split capacitors C21*a* to C21*d*, the capacitor C22, each of the split capacitors C23*a* to C23*e*, and each of the split capacitors C24*a* to C24*j* in the odd-numbered column region OCA have the same capacitance value.

As described above, the input capacitances connected to the NMOS transistor NT21 and the NMOS transistor NT22 constituting the differential pair of the differential amplifier 212 are divided into the same number of capacitors. As a result, the capacitance connected to the differential pair of the differential amplifier 212 is balanced. Further, the variation in the power source VDD1 can be caused to affect the differential pair of the differential amplifier 212 equally. Thus, improvement of the power supply rejection ratio is achieved. In addition, the voltage variation based on leakage currents occurring in the switch SW21 and the switch SW22 provided in the comparator 121b can be made identical between the NMOS transistor NT21 and the NMOS transistor NT22. As a result, the image sensor according to this modified example is capable of preventing the leakage current from affecting the comparing operation of the comparator 121b.

The differential pair of the differential amplifier 212 including the NMOS transistor NT11 and the NMOS transistor NT12 exhibits the same operation and effects as those of the differential pair including the NMOS transistor NT21 and the NMOS transistor NT22.

Due to the limitation of the size of the semiconductor chip on which the image sensor according to this modified example is formed, the even-numbered column region ECA and the odd-numbered column region OCA are provided adjacent to each other. For this reason, a parasitic capacitance is generated between each element formed in the even-numbered column region ECA and each element formed in the odd-numbered column region OCA.

Regarding the capacitor C11, the capacitor C12, the capacitor C13, the capacitor C14, and the NMOS transistors NT11 and NT12, parasitic capacitances generated between the even-numbered column region ECA and the odd-numbered column region OCA are similar to those in the image sensor 1 according to the embodiment described above (see FIG. 7). For this reason, detailed description of the parasitic capacitance is omitted.

As shown in FIG. 15, a parasitic capacitance Cp31 is generated between a gate of the split transistor NT21a in the even-numbered column region ECA and a gate of the split transistor NT21a in the odd-numbered column region OCA. A parasitic capacitance Cp32 is generated between a gate of the split transistor NT22a in the even-numbered column region ECA and a gate of the split transistor NT21b in the odd-numbered column region OCA. A parasitic capacitance Cp33 is generated between a gate of the split transistor NT22b in the even-numbered column region ECA and a gate of the split transistor NT22b in the odd-numbered column region OCA. A parasitic capacitance Cp34 is generated between a gate of the split transistor NT21b of the even-numbered column region ECA and a gate of the split transistor NT22a in the odd-numbered column region OCA.

A parasitic capacitance Cp35 is generated between the split capacitor C24a in the even-numbered column region ECA and the split capacitor C24a in the odd-numbered column region OCA. A parasitic capacitance Cp36 is generated between the split capacitor C24b in the even-numbered column region ECA and the split capacitor C24b in the odd-numbered column region OCA. A parasitic capacitance Cp37 is generated between the split capacitor C24c in the even-numbered column region ECA and the split capacitor C24c in the odd-numbered column region OCA. A parasitic capacitance Cp38 is generated between the split capacitor C24d in the even-numbered column region ECA and the split capacitor C24d in the odd-numbered column region OCA. A parasitic capacitance Cp39 is generated between the split capacitor C24e in the even-numbered column region ECA and the split capacitor C24e in the odd-numbered column region OCA. A parasitic capacitance Cp40 is generated between the split capacitor C24f in the even-numbered column region ECA and the split capacitor C24f in the odd-numbered column region OCA.

A parasitic capacitance Cp41 is generated between the split capacitor C24g in the even-numbered column region ECA and the split capacitor C21a in the odd-numbered column region OCA. A parasitic capacitance Cp42 is generated between the split capacitor C24h in the even-numbered column region ECA and the split capacitor C21b in the odd-numbered column region OCA. A parasitic capacitance Cp43 is generated between the split capacitor C24i in the even-numbered column region ECA and the split capacitor C21c in the odd-numbered column region OCA. A parasitic capacitance Cp44 is generated between the split capacitor C21a in the even-numbered column region ECA and the split capacitor C21d in the odd-numbered column region OCA.

A parasitic capacitance Cp45 is generated between the split capacitor C21b in the even-numbered column region ECA and the split capacitor C24g in the odd-numbered column region OCA. A parasitic capacitance Cp46 is generated between the split capacitor C21c in the even-numbered column region ECA and the split capacitor C24h in the odd-numbered column region OCA. A parasitic capacitance Cp47 is generated between the split capacitor C21d in the even-numbered column region ECA and the split capacitor C24i in the odd-numbered column region OCA. A parasitic capacitance Cp48 is generated between the split capacitor C24j in the even-numbered column region ECA and the split capacitor C24j in the odd-numbered column region OCA.

A parasitic capacitance Cp49 is generated between the split capacitor C23a in the even-numbered column region ECA and the split capacitor C23a in the odd-numbered column region OCA. A parasitic capacitance Cp50 is generated between the split capacitor C23b in the even-numbered column region ECA and the split capacitor C23b in the odd-numbered column region OCA. A parasitic capacitance Cp51 is generated between the split capacitor C23c in the even-numbered column region ECA and the split capacitor C23c in the odd-numbered column region OCA. A parasitic capacitance Cp52 is generated between the split capacitor C23d in the even-numbered column region ECA and the split capacitor C23d in the odd-numbered column region OCA. A parasitic capacitance Cp53 is generated between the split capacitor C23e in the even-numbered column region ECA and the split capacitor C23e in the odd-numbered column region OCA. A parasitic capacitance Cp54 is generated between the capacitor C22 in the even-numbered column region ECA and the capacitor C22 in the odd-numbered column region OCA.

The image sensor according to this modified example includes two differential pairs in the differential amplifier 212, and the arrangement of the capacitances is different between the even-numbered column region ECA and the odd-numbered column region OCA for each of the differential pairs. No matter how all or a part of the capacitors C13 that function as the switching capacitors is added as the input capacitance for the pixel signal VSL1 and the reference signal RAMP1, the absolute value of the imbalance of the interference of the large-amplitude aggressor of the adjacent pixel signal VSL1 is not eminently large for one differential pair of the differential amplifier 212. Similarly, no matter how all or a part of the capacitor C23 that function as the switching capacitances is added as the input capacitance for the pixel signal VSL2 and the reference signal RAMP2, the absolute value of the imbalance of the interference of the large-amplitude aggressor of the adjacent pixel signal VSL2 is not prominently large for the other differential pair of the differential amplifier 212.

More specifically, the split capacitors C21a to C21d (example of a fifth split capacitance) in the odd-numbered column region OCA are arranged so that the number of split capacitors facing the split capacitors C21a to C21d (example of a first split capacitance) in the even-numbered column region ECA and the number of split capacitors facing the split capacitors C24a to C24j (example of a fourth split capacitance) in the even-numbered column region ECA differ. In the configuration example shown in FIG. 15, three split capacitors C21a to C21c of the split capacitors C21a to C21d in the odd-numbered column region OCA are arranged facing the split capacitors C24g to C24i connected to the NMOS transistor NT22 in the even-numbered column region ECA. Further, one split capacitor C21d of the split capacitors C21a to C21d in the odd-numbered column region OCA is disposed facing the split capacitor C21a connected to the NMOS transistor NT21 in the even-numbered column region ECA.

The split capacitors C21a to C21d, the capacitor C22, and the split capacitors C23a to C23e are connected in parallel. Further, the split capacitors C24a to C24j are connected in parallel. For this reason, the number of split capacitors facing each other can also be viewed as the area in which the capacitors including the split capacitors face each other. Therefore, the capacitor C21 (example of a fifth capacitance) in the odd-numbered column region OCA is disposed facing the capacitor C21 (example of a first capacitance) and the capacitor C24 (example of a fourth capacitance) in the even-numbered column region ECA with different areas.

The split capacitors C11a to C11d in the odd-numbered column region OCA are arranged facing the split capacitors C14g to C14i connected to the NMOS transistor NT12 and the split capacitor C11a connected to the NMOS transistor NT11 in the even-numbered column region ECA, similarly to the split capacitors C11a to C11d in the odd-numbered column region OCA in the above-mentioned embodiment.

Therefore, although the detailed description is omitted, the image sensor according to this modified example is capable of reducing crosstalk between ADCs 105i (i is an even number less than or equal to n) in the even-numbered column region ECA and ADCs 105i (i is an odd number less than or equal to n) in the odd-numbered column region OCA adjacent to each other. More specifically, crosstalk in the differential pair of the NMOS transistors NT11 and NT12 of ADCs 105 (2i) (i is an odd number less than or equal to n) in the even-numbered column region ECA and ADCs 105 (2i-1) (i is an odd number less than or equal to n) in the odd-numbered column region OCA is reduced. Further, crosstalk in the differential pair of the NMOS transistors NT21 and NT22 of the ADCs 105 (2i) (i is an even number less than or equal to n) in the even-numbered column region ECA and the ADCs 105 (2i-1) (i is an even number less than or equal to n) in the odd-numbered column region OCA is reduced.

<Configuration Example in Case where Image Sensor Includes Semiconductor Chip>

Next, a configuration example in the case where an image sensor includes a semiconductor chip will be described using FIG. 16 and FIG. 17.

Figure 16:
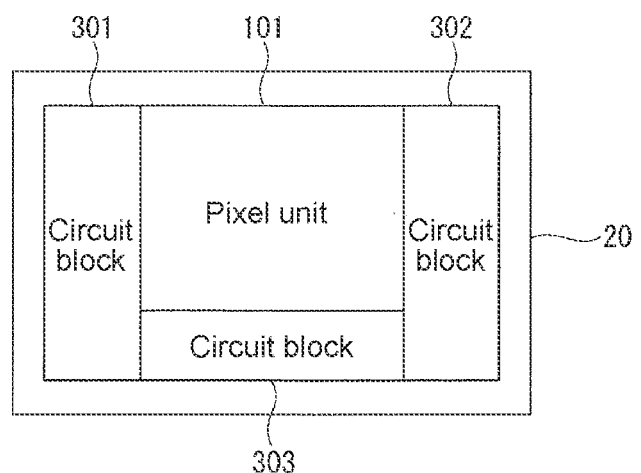
FIG. 16 is a schematic diagram showing a configuration example in the case where the image sensor according to the embodiment of the present technology includes one bare chip.

As shown in FIG. 16, in the case where the image sensor includes one bare chip, for example, the pixel unit 101 is formed on one bare chip 20. Circuit blocks 301, 302, and 303 that include circuits other than the pixel unit 101, such as the ADC group 12, the timing control circuit 102, the vertical scanning circuit 103, the DAC 104, and the horizontal transfer scanning circuit 106, are formed on a periphery of the pixel unit 101.

Figure 17:
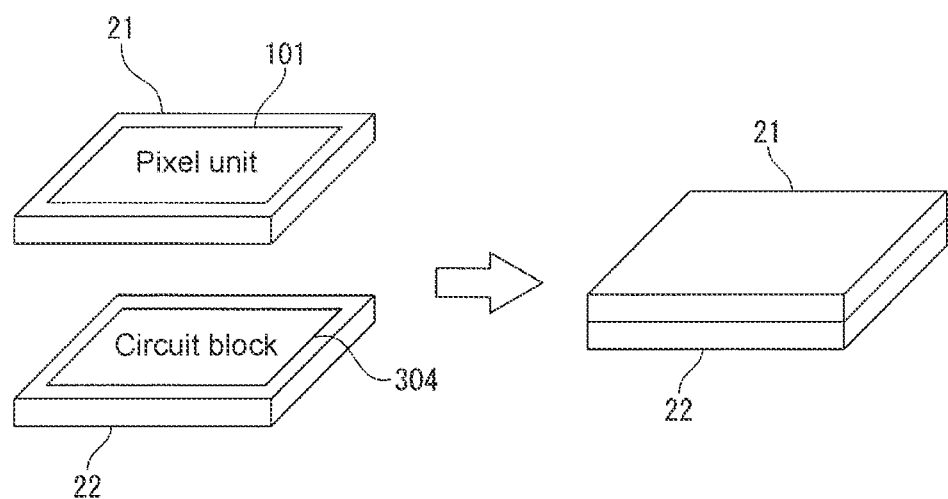
FIG. 17 is a schematic diagram showing a configuration example in the case where the image sensor according to the embodiment of the present technology includes two bare chips.

As shown in FIG. 17, in the case where a stacked image sensor includes two bare chips stacked one above the other, the pixel unit 101 is formed on an upper chip 21 stacked on the upper side of the two bare chips. Further, a circuit block 304 that includes circuits other than the pixel unit 101, such as the ADC group 12, the timing control circuit 102, the vertical scanning circuit 103, the DAC 104, and the horizontal transfer scanning circuit 106, is formed on a lower chip 22 stacked on the lower side. The ADC 105 that includes the comparator 121 is formed in the circuit block 304 provided in the lower chip 22. Note that the comparator 121 and the ADC 105 may be formed in the upper chip 21.

As shown in FIG. 17, in the case where a stacked image sensor is formed, i.e., in the case where the image sensor includes the upper chip 21 in which the pixel unit 101 is formed and the lower chip 22 in which the circuit block 304 is formed, it is sometimes required to configure the lower chip 22 to have the same size as the size of the upper chip 21.

The upper chip 21 in which the pixel unit 101 is formed can be configured to have a size similar to the size of the pixel unit 101 formed on one bare chip 20 shown in FIG. 16. In the case where the lower chip 22 is configured to have the same size as the size of the upper chip 21, all of the circuits included in the circuit blocks 301 to 303 shown in FIG. 16 need to be formed as the circuit block 304 in the lower chip 22 configured to have the same size as the size of the upper chip 21.

Therefore, further miniaturization is required for the circuit such as the ADC group 12 included in the circuit block 304. For example, for the ADC 105, it is required that the distance between adjacent columns (column pitch) be shorter than that in the case where the image sensor includes one bare chip 20 shown in FIG. 16.

Even in such a case, crosstalk in the ADC 105 can be reduced by disposing the capacitor C11 in the odd-numbered column region OCA so as to face the capacitor C11 and the capacitor C14 in the even-numbered column region ECA with different areas.

Various modifications can be made to the present technology regardless of the above-mentioned embodiment.

In the above-mentioned embodiment, the capacitors C11 in the even-numbered column region ECA and the odd-numbered column region OCA are shifted by the amount corresponding to one split capacitor, but the present technology is not limited thereto. The degree to which the capacitors C11 in the even-numbered column region ECA and the odd-numbered column region OCA are shifted differs depending on the capacitance values of the respective portions and the number of capacitances determined by the required specifications of the ADC and the like.

The technology according to the present disclosure is applicable to the above-mentioned solid-state imaging device.

Note that embodiments of the present technology are not limited to the embodiment described above, and various modifications can be made without departing from the essence of the present technology. Further, the effects described herein are merely illustrative and not restrictive, and may have other effects.

For example, the present technology may also take the following configurations.

(1) An image sensor, including:

a first capacitance that is connected to a first signal line connected to a first pixel including a photoelectric conversion element and disposed in a first region;

a second capacitance that is disposed in the first region and connected to a reference signal generation unit that generates a reference signal;

a third capacitance that is disposed in the first region and provided to be connectable to the first capacitance and the second capacitance;

a fourth capacitance that is disposed in the first region and connected to a supply unit of a reference potential;

a first differential amplifier that is disposed in the first region and includes one input unit and a different input unit, the first capacitance, the second capacitance, and the third capacitance being connected to the one input unit, the fourth capacitance being connected to the different input unit;

a fifth capacitance that is connected to a second signal line connected to a second pixel including a photoelectric conversion element and disposed in a second region adjacent to the first region to face the first capacitance and the fourth capacitance with different areas;

a sixth capacitance that is disposed in the second region and connected to the reference signal generation unit;

a seventh capacitance that is disposed in the second region and provided to be connectable to the fifth capacitance and the sixth capacitance;

an eighth capacitance that is disposed in the second region, the reference potential being supplied to the eighth capacitance; and a second differential amplifier that is disposed in the second region and includes one input unit and a different input unit, the fifth capacitance, the sixth capacitance, and the seventh capacitance being connected to the one input unit, the eighth capacitance being connected to the different input unit.

(2) The image sensor according to (1) above, in which each of the first capacitance, the third capacitance, the fourth capacitance, the fifth capacitance, the seventh capacitance, and the eighth capacitance includes a plurality of split capacitances, and fifth split capacitances that are the split capacitances of the fifth capacitance are arranged so that the number of the fifth split capacitances facing first split capacitances that are the split capacitances of the first capacitance and the number of the fifth split capacitances facing fourth split capacitances that are the split capacitances of the fourth capacitance differ.

(3) The image sensor according to (2) above, in which third split capacitances that are the split capacitances of the third capacitance are aggregated within a predetermined range of the first region, seventh split capacitances that are the split capacitances of the seventh capacitance are aggregated within a predetermined range of the second region, and the plurality of third split capacitances and the plurality of seventh split capacitances are arranged facing each other in a one-to-one relationship.

(4) The image sensor according to (3) above, further including:

a first switching element for switching between connection and disconnection of the first capacitance and the third capacitance;

a second switching element for switching between connection and disconnection of the second capacitance and the third capacitance;

a third switching element for switching between connection and disconnection of two adjacent split capacitances of the third split capacitances;

a fifth switching element for switching between connection and disconnection of the fifth capacitance and the seventh capacitance;

a sixth switching element for switching between connection and disconnection of the sixth capacitance and the seventh capacitance; and a seventh switching element for switching between connection and disconnection of two adjacent split capacitances of the seventh split capacitances.

(5) The image sensor according to (4) above, in which the total number of the first split capacitances, the second capacitances, and the third split capacitances is the same as the total number of fourth split capacitances that are the split capacitances of the fourth capacitance, the total number of the fifth split capacitances, the sixth capacitances, and the seventh split capacitances is the same as the total number of eighth split capacitances that are the split capacitances of the eighth capacitance, and the total number of the first split capacitances, the second capacitances, the third split capacitances, and the fourth split capacitances is the same as the total number of the fifth split capacitances, the sixth capacitances, the seventh split capacitances, and the eighth split capacitances.

(6) The image sensor according to (5) above, in which each of the plurality of first split capacitances, the second capacitance, each of the plurality of third split capacitances, each of the plurality of fourth split capacitances, each of the fifth split capacitances, the sixth capacitance, each of the plurality of seventh split capacitances, and each of the plurality of eighth split capacitances have the same capacitance value.

(7) The image sensor according to (5) or (6) above, in which each of the plurality of first split capacitances includes one electrode connected to the first signal line and a different electrode connected to the one input unit of the first differential amplifier, the second capacitance includes one electrode connected to the reference signal generation unit and a different electrode connected to the one input unit of the first differential amplifier, each of the plurality of third split capacitances includes one electrode connected to the third switching element and a different electrode connected to the one input unit of the first differential amplifier, each of the plurality of fourth split capacitances includes one electrode connected to the supply unit of the reference potential and a different electrode connected to the different input unit of the first differential amplifier, each of the plurality of fifth split capacitances includes one electrode connected to the second signal line and a different electrode connected to the one input unit of the second differential amplifier, the sixth capacitance includes one electrode connected to the reference signal generation unit and a different electrode connected to the one input unit of the second differential amplifier, each of the plurality of seventh split capacitances includes one electrode connected to the seventh switching element and a different electrode connected to the one input unit of the second differential amplifier, and each of the plurality of eighth split capacitances includes one electrode connected to the supply unit of the reference potential and a different electrode connected to the different input unit of the second differential amplifier.

REFERENCE SIGNS LIST

1 image sensor
4 signal processing unit
5 output unit 6 control unit
12 ADC group
20 bare chip
21 upper chip
22 lower chip
100 digital camera
101 pixel unit
102 timing control circuit
103 vertical scanning circuit
106 horizontal transfer scanning circuit
107 amplifier circuit
108 signal processing circuit
109 pixel drive line
110 vertical signal line
111 horizontal transfer line
121, 121a, 121b comparator
122 counter
123 latch
151 photodiode
152 transfer transistor
154 amplifier transistor
155 selection transistor 156 reset transistor
157 constant current source
201, 211, 212 differential amplifier
301, 302, 303, 304 circuit block
C11 to C15, C21 to C25 capacitor
C11a to C11d, C13a to C13e, C14a to C14j, C21a to C21d, C23a to C23e, C24a to C24j split capacitor
Cp1 to Co24, Cp34 to Co54 parasitic capacitance
NT11, NT12, NT13, NT21, NT22, NT23, TN21, NT32 NMOS transistor
NT11a, NT11b, NT12a, NT12b, NT21a, NT21b split transistor
NT22a, NT22b split transistor
OCA odd-numbered column region
P unit pixel
PT11, PT12, PT31, PT32, PT33 PMOS transistor
RAMP, RAMP1, RAMP2 reference signal
SW11 to SW14, SW13a to SW13d, SW15a to SW15e, SW17, SW18, SW21 to SW24, SW23a to SW23d, SW25a to SW25e, SW27, SW28 switch
SW15, SW25 switch group
VSL, VSL1, VSL2 pixel signal

The invention claimed is:

1. An image sensor, comprising:
a first capacitance that is connected to a first signal line connected to a first pixel including a photoelectric conversion element and disposed in a first region;
a second capacitance that is disposed in the first region and connected to reference signal generation circuitry that generates a reference signal;
a third capacitance that is disposed in the first region and provided to be connectable to the first capacitance and the second capacitance;
a fourth capacitance that is disposed in the first region, a reference potential being supplied to the fourth capacitance;
a first differential amplifier that is disposed in the first region and includes a first input and a second input, the first capacitance, the second capacitance, and the third capacitance being connected to the first input, the fourth capacitance being connected to the second input;
a fifth capacitance that is connected to a second signal line connected to a second pixel including a photoelectric conversion element and disposed in a second region adjacent to the first region to face the first capacitance and the fourth capacitance with different areas;
a sixth capacitance that is disposed in the second region and connected to the reference signal generation circuitry;
a seventh capacitance that is disposed in the second region and provided to be connectable to the fifth capacitance and the sixth capacitance;
an eighth capacitance that is disposed in the second region, the reference potential being supplied to the eighth capacitance; and
a second differential amplifier that is disposed in the second region and includes a third input and a fourth input, the fifth capacitance, the sixth capacitance, and the seventh capacitance being connected to the third input, the eighth capacitance being connected to the fourth input.

2. The image sensor according to claim 1, wherein
each of the first capacitance, the third capacitance, the fourth capacitance, the fifth capacitance, the seventh capacitance, and the eighth capacitance includes a plurality of split capacitances, and
fifth split capacitances that are the split capacitances of the fifth capacitance are arranged so that the number of the fifth split capacitances facing first split capacitances that are the split capacitances of the first capacitance and the number of the fifth split capacitances facing fourth split capacitances that are the split capacitances of the fourth capacitance differ.

3. The image sensor according to claim 2, wherein
third split capacitances that are the split capacitances of the third capacitance are aggregated within a predetermined range of the first region,
seventh split capacitances that are the split capacitances of the seventh capacitance are aggregated within a predetermined range of the second region, and
the plurality of third split capacitances and the plurality of seventh split capacitances are arranged facing each other in a one-to-one relationship.

4. The image sensor according to claim 3, further comprising:
a first switching element for switching between connection and disconnection of the first capacitance and the third capacitance;
a second switching element for switching between connection and disconnection of the second capacitance and the third capacitance;
a third switching element for switching between connection and disconnection of two adjacent split capacitances of the third split capacitances;
a fifth switching element for switching between connection and disconnection of the fifth capacitance and the seventh capacitance;
a sixth switching element for switching between connection and disconnection of the sixth capacitance and the seventh capacitance; and
a seventh switching element for switching between connection and disconnection of two adjacent split capacitances of the seventh split capacitances.

5. The image sensor according to claim 4, wherein
the total number of the first split capacitances, the second capacitances, and the third split capacitances is the same as the total number of fourth split capacitances that are the split capacitances of the fourth capacitance,
the total number of the fifth split capacitances, the sixth capacitances, and the seventh split capacitances is the same as the total number of eighth split capacitances that are the split capacitances of the eighth capacitance, and the total number of the first split capacitances, the second capacitances, the third split capacitances, and the fourth split capacitances is the same as the total number of the fifth split capacitances, the sixth capacitances, the seventh split capacitances, and the eighth split capacitances.

6. The image sensor according to claim 5, wherein
each of the plurality of first split capacitances, the second capacitance, each of the plurality of third split capacitances, each of the plurality of fourth split capacitances, each of the fifth split capacitances, the sixth capacitance, each of the plurality of seventh split capacitances, and each of the plurality of eighth split capacitances have the same capacitance value.

7. The image sensor according to claim 5, wherein
each of the plurality of first split capacitances includes one electrode connected to the first signal line and a different electrode connected to the first input,
the second capacitance includes one electrode connected to the reference signal generation circuitry and a different electrode connected to the first input,
each of the plurality of third split capacitances includes one electrode connected to the third switching element and a different electrode connected to the first input,
each of the plurality of fourth split capacitances includes one electrode connected to the reference potential and a different electrode connected to the second input,
each of the plurality of fifth split capacitances includes one electrode connected to the second signal line and a different electrode connected to the third input,
the sixth capacitance includes one electrode connected to the reference signal generation circuitry and a different electrode connected to the third input,
each of the plurality of seventh split capacitances includes one electrode connected to the seventh switching element and a different electrode connected to the third input, and
each of the plurality of eighth split capacitances includes one electrode connected to the reference potential and a different electrode connected to the fourth input.

\* \* \* \* \*